(12) United States Patent
Kim et al.

(10) Patent No.: US 12,136,463 B2
(45) Date of Patent: Nov. 5, 2024

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Kiheung Kim, Suwon-si (KR); Sanguhn Cha, Suwon-si (KR); Junhyung Kim, Suwon-si (KR); Sungchul Park, Seoul (KR); Hyojin Jung, Hwaseong-si (KR); Kyungsoo Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/113,702

(22) Filed: Feb. 24, 2023

(65) Prior Publication Data

US 2023/0223095 A1    Jul. 13, 2023

Related U.S. Application Data

(63) Continuation of application No. 17/374,822, filed on Jul. 13, 2021, now Pat. No. 11,615,861.

(30) Foreign Application Priority Data

Dec. 29, 2020   (KR) .................. 10-2020-0185741

(51) Int. Cl.
*G11C 29/00*   (2006.01)
*G11C 29/20*   (2006.01)
(Continued)

(52) U.S. Cl.
CPC .............. *G11C 29/42* (2013.01); *G11C 29/20* (2013.01); *G11C 29/4401* (2013.01); *G11C 2029/1204* (2013.01)

(58) Field of Classification Search
CPC ............... G06F 11/106; G06F 11/1044; G06F 11/1016; G06F 11/1076; G06F 11/1048;
(Continued)

(56) References Cited

U.S. PATENT DOCUMENTS 7,100,004 B2   8/2006   Johnson et al.
8,347,176 B2   1/2013   Resnick et al.
(Continued)

FOREIGN PATENT DOCUMENTS

KR   1020120136674 A   12/2012

*Primary Examiner* — Thong Q Le
(74) *Attorney, Agent, or Firm* — Muir Patent Law, PLLC

(57) ABSTRACT

A semiconductor memory device includes a memory cell array, an error correction code (ECC) circuit, a fault address register and a control logic circuit. The memory cell array includes a plurality of memory cell rows. The scrubbing control circuit generates scrubbing addresses for performing a scrubbing operation on a first memory cell row based on refresh row addresses for refreshing the memory cell rows. The control logic circuit controls the ECC circuit such that the ECC circuit performs an error detection and correction operation on a plurality of sub-pages in the first memory cell row to count a number of error occurrences during a first interval and determines a sub operation in a second interval in the scrubbing operation based on the number of error occurrences in the first memory cell row.

18 Claims, 25 Drawing Sheets

(51) Int. Cl.
*G11C 29/42* (2006.01)
*G11C 29/44* (2006.01)
*G11C 29/12* (2006.01)

(58) Field of Classification Search
CPC ............. G06F 11/0772; G06F 11/1068; G06F 11/076; G06F 11/1012; G06F 11/1052; G06F 11/3037; G06F 12/0882; G06F 13/1668; G06F 13/1673; H03M 13/1105; H03M 13/13; H03M 13/1575
USPC .................................................... 365/185.09
See application file for complete search history.

(56) References Cited

U.S. PATENT DOCUMENTS

| | | |
|---|---|---|
| 9,053,813 B2 | 6/2015 | Kang et al. |
| 9,600,362 B2 | 3/2017 | Kang et al. |
| 10,127,101 B2 | 11/2018 | Halbert et al. |
| 2006/0256615 A1 | 11/2006 | Larson |
| 2019/0371391 A1* | 12/2019 | Cha .................... G06F 11/1016 |
| 2020/0210278 A1 | 7/2020 | Rooney et al. |

\* cited by examiner

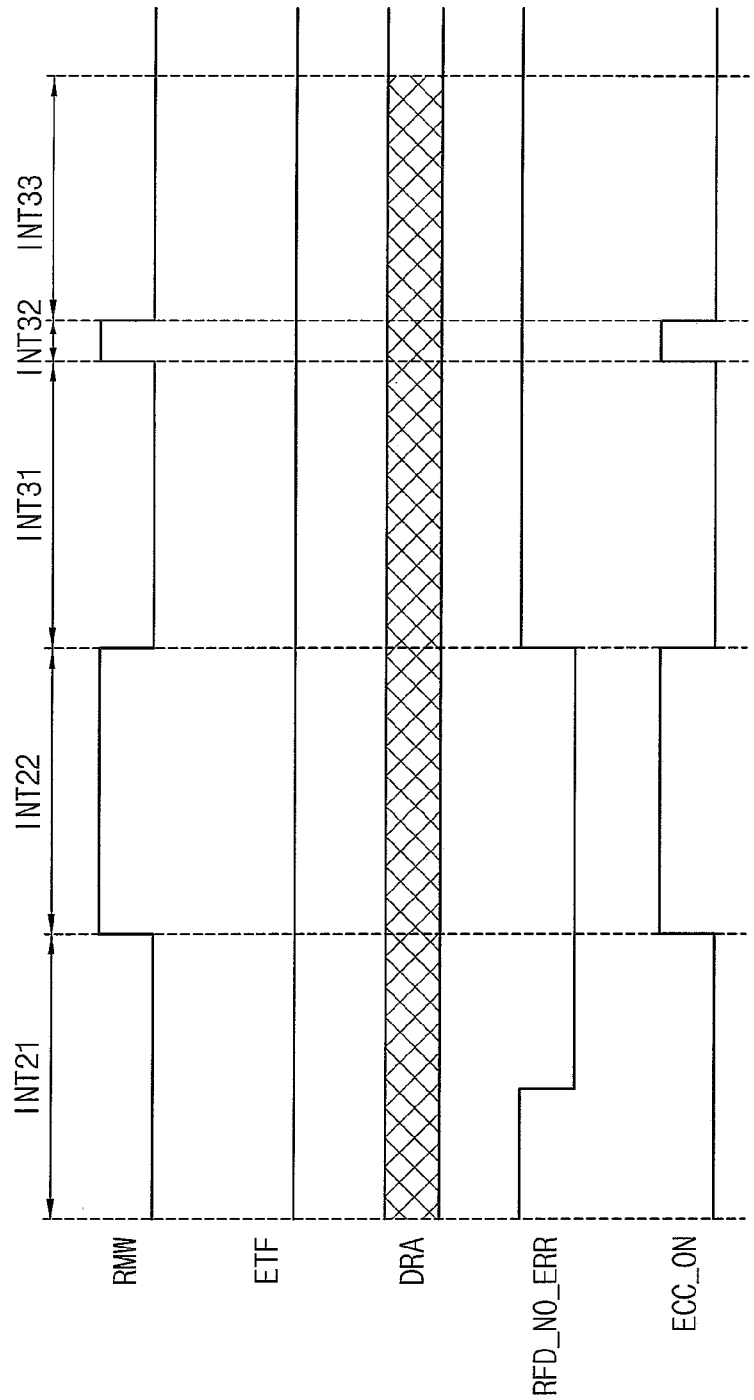

SEMICONDUCTOR MEMORY DEVICES AND METHODS OF OPERATING SEMICONDUCTOR MEMORY DEVICES

CROSS-REFERENCE TO RELATED APPLICATION(S)

This application is a Continuation of U.S. patent application Ser. No. 17/374,822 filed on Jul. 13, 2021, now Allowed, which claims the benefit of priority under 35 USC § 119 to Korean Patent Application No. 10-2020-0185741, filed on Dec. 29, 2020, in the Korean Intellectual Property Office, the disclosure of each of which is incorporated by reference in its entirety herein.

BACKGROUND

Example embodiments relate to memories, and more particularly to semiconductor memory devices, and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. Therefore, there is a need for greater reliability of the semiconductor memory device.

SUMMARY

Some example embodiments provide a semiconductor memory device with enhanced reliability and performance.

Some example embodiments provide a method of operating a semiconductor memory device with enhanced reliability and performance.

According to example embodiments, a semiconductor memory device includes a memory cell array, an error correction code (ECC) circuit, a fault address register and a control logic circuit. The memory cell array includes a plurality of memory cell rows, and each of the plurality of memory cell rows includes volatile memory cells coupled to a plurality of bit-lines. The scrubbing control circuit generates scrubbing addresses for performing a scrubbing operation on a first memory cell row selected from the plurality of memory cell rows based on refresh row addresses for refreshing the memory cell rows. The control logic circuit configured to control the ECC circuit and the scrubbing control circuit. The control logic circuit controls the ECC circuit such that the ECC circuit performs an error detection and correction operation on a plurality of codewords of a plurality of sub-pages in the first memory cell row by unit of codeword to count a number of error occurrences during a first interval in the scrubbing operation; performs a row fault detection operation to selectively store a row address of the first memory cell row in the fault address register as a row fault address based on the number of error occurrences in the first memory cell row; and determines a sub operation in a second interval in the scrubbing operation after the first interval based on the number of error occurrences in the first memory cell row.

According to example embodiments, there is provided a method of operating a semiconductor memory device which includes a memory cell array that includes a plurality of memory cell rows, and each of the plurality of memory cell rows includes a plurality of volatile memory cells. According to the method, a first memory cell row is selected from the plurality of memory cell rows based on refresh row addresses for refreshing memory cells connected to the memory cell rows, an error detection and correction operation on a plurality of codewords of a plurality of sub-pages in the first memory cell row is performed by an error correction code (ECC) circuit by unit of codeword to count a number of error occurrences during a first interval in a scrubbing operation, and a sub operation in a second interval of the scrubbing operation is determined based on the number of error occurrences. The sub operation includes one of writing back a corrected codeword in a corresponding sub-page in the first memory cell row and the error detection and correction operation on a second memory cell row of the plurality of memory cell rows different from the first memory cell row.

According to example embodiments, a semiconductor memory device includes a memory cell array, an error correction code (ECC) circuit, a fault address register and a control logic circuit. The memory cell array includes a plurality of memory cell rows, and each of the plurality of memory cell rows includes volatile memory cells coupled to a plurality of bit-lines. The scrubbing control circuit generates scrubbing addresses for performing a scrubbing operation on a first memory cell row selected from the plurality of memory cell rows based on refresh row addresses for refreshing the memory cell rows. The control logic circuit configured to control the ECC circuit and the scrubbing control circuit. The control logic circuit controls the ECC circuit such that the ECC circuit performs an error detection and correction operation on a plurality of codewords of a plurality of sub-pages in the first memory cell row by unit of codeword to count a number of error occurrences during a first interval in the scrubbing operation; performs a row fault detection operation to selectively store a row address of the first memory cell row in the fault address register as a row fault address based on the number of error occurrences in the first memory cell row; and determines a sub operation in a second interval in the scrubbing operation based on the number of error occurrences in the first memory cell row. The control logic circuit controls the ECC circuit to perform the error detection and correction operation on a plurality of sub-pages in a second memory cell row different from the first memory cell row, selected from the plurality of memory cell rows, in response to the number of error occurrences in the first memory cell row being a zero. The sub operation includes one of writing back a corrected codeword in a corresponding sub-page in the first memory cell row and the error detection and correction operation on a second memory cell row different from the first memory cell row.

Accordingly, a semiconductor memory device includes an ECC circuit, a scrubbing control circuit and a fault address register. The ECC circuit may rapidly perform scrubbing operation during an initial interval after a power is applied to the semiconductor memory device and a memory cell row having a row fault may be rapidly detected.

BRIEF DESCRIPTION OF THE DRAWINGS

Example embodiments will be described below in more detail with reference to the accompanying drawings.

FIG. 23 illustrates that a scrubbing operation is performed in the semiconductor memory device of FIG. 2.

DETAILED DESCRIPTION

Various example embodiments will be described more fully hereinafter with reference to the accompanying drawings, in which example embodiments are shown.

Figure 1:
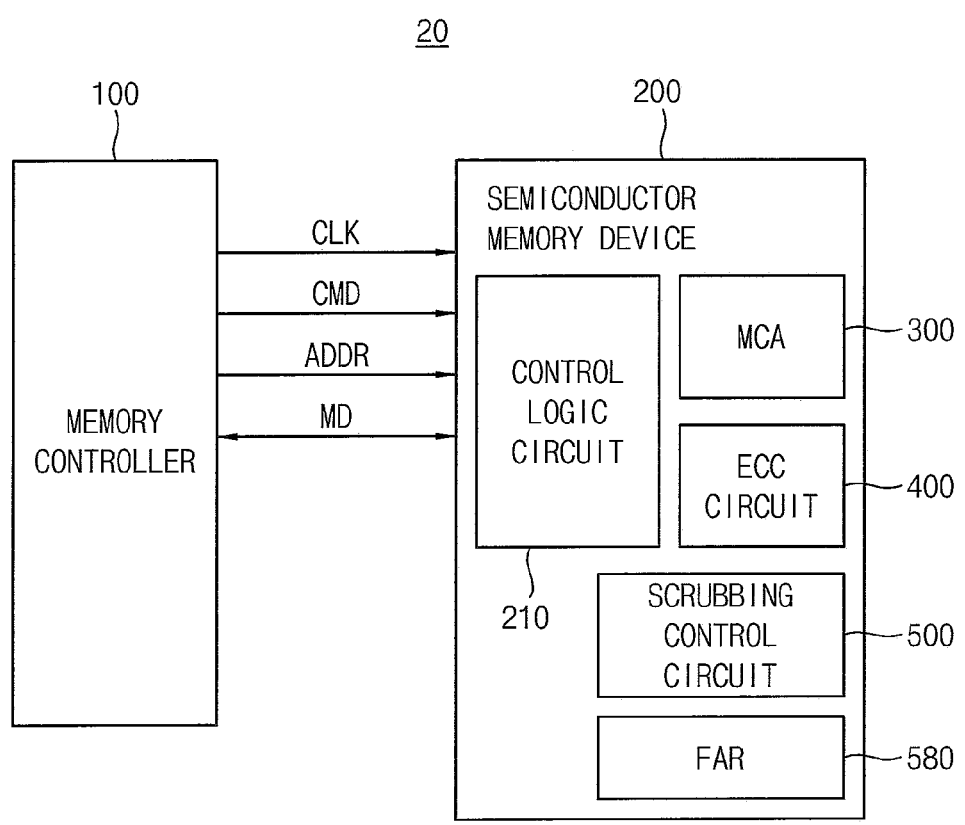
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), DDR5 SDRAM, a low power DDR4 (LPDDR4) SDRAM, a LPDDR5 SDRAM or a LPDDR6 DRAM.

The memory controller 100 transmits a clock signal CLK, a command CMD, and an address (signal) ADDR to the semiconductor memory device 200 and exchanges main data MD with the semiconductor memory device 200.

The semiconductor memory device 200 includes a memory cell array 300 that stores the main data MD and parity data, an error correction code (ECC) circuit 400, a control logic circuit 210, a scrubbing control circuit 500 and a fault address register FAR 580.

The ECC circuit 400 may perform ECC encoding on a write data to be stored in a target page of the memory cell array 300, and may perform ECC decoding or decoding on a codeword read from the target page under control of the control logic circuit 210.

The scrubbing control circuit 500 may generate scrubbing addresses such that scrubbing operation is performed on a first memory cell row of a plurality of memory cell rows whenever refresh operation is performed on N memory cell rows when the refresh operation is performed on the plurality of memory cell rows included in the memory cell array 300. Here, N is a natural number equal to or greater than three. In an accelerated scrubbing mode, the scrubbing control circuit 500 may generate the scrubbing addresses whenever refresh operation is performed on memory cell rows smaller than N memory cell rows.

The scrubbing operation may include an error detection and correction operation performed during a first interval of the scrubbing operation and a sub operation performed during a second interval of the scrubbing operation.

The control logic circuit 210 may control the ECC circuit 400 such that the ECC circuit 400 performs an error detection and correction operation on a plurality of sub-pages in the first memory cell row by unit of codeword to count a number of error occurrences and performs a row fault detection operation to selectively store a row address of the first memory cell row in the fault address register 580 as a row fault address based on the number of error occurrences in the first memory cell row during the first interval in the scrubbing operation. The control logic circuit 210 may determine the sub operation in the second interval of the scrubbing operation based on the number of error occurrences in the first memory cell row. The sub operation may include one of writing back a corrected codeword (C_CW) and the error detection and correction operation on a second memory cell row different from the first memory cell row.

The control logic circuit 210 may control the ECC circuit 400 to write back the corrected codeword in a corresponding sub-page in the first memory cell row in response to the number of error occurrences being smaller than a reference value. The control logic circuit 210 may control the ECC circuit 400 not to write back the corrected codeword in a corresponding sub-page in the first memory cell row in response to the number of error occurrences being equal to or greater than the reference value. The control logic circuit 210 may control the ECC circuit 400 to perform the error detection and correction operation on the second memory cell row in the second interval of the scrubbing operation.

When an access address is associated with a read command from the memory controller 100 and the access address matches the row fault address after a row address of the first memory cell row is stored in the fault address register 580 as a row fault address the control logic circuit 210 may control the ECC circuit 400 to skip an ECC decoding on a memory cell row designated by the access address.

Figure 2:
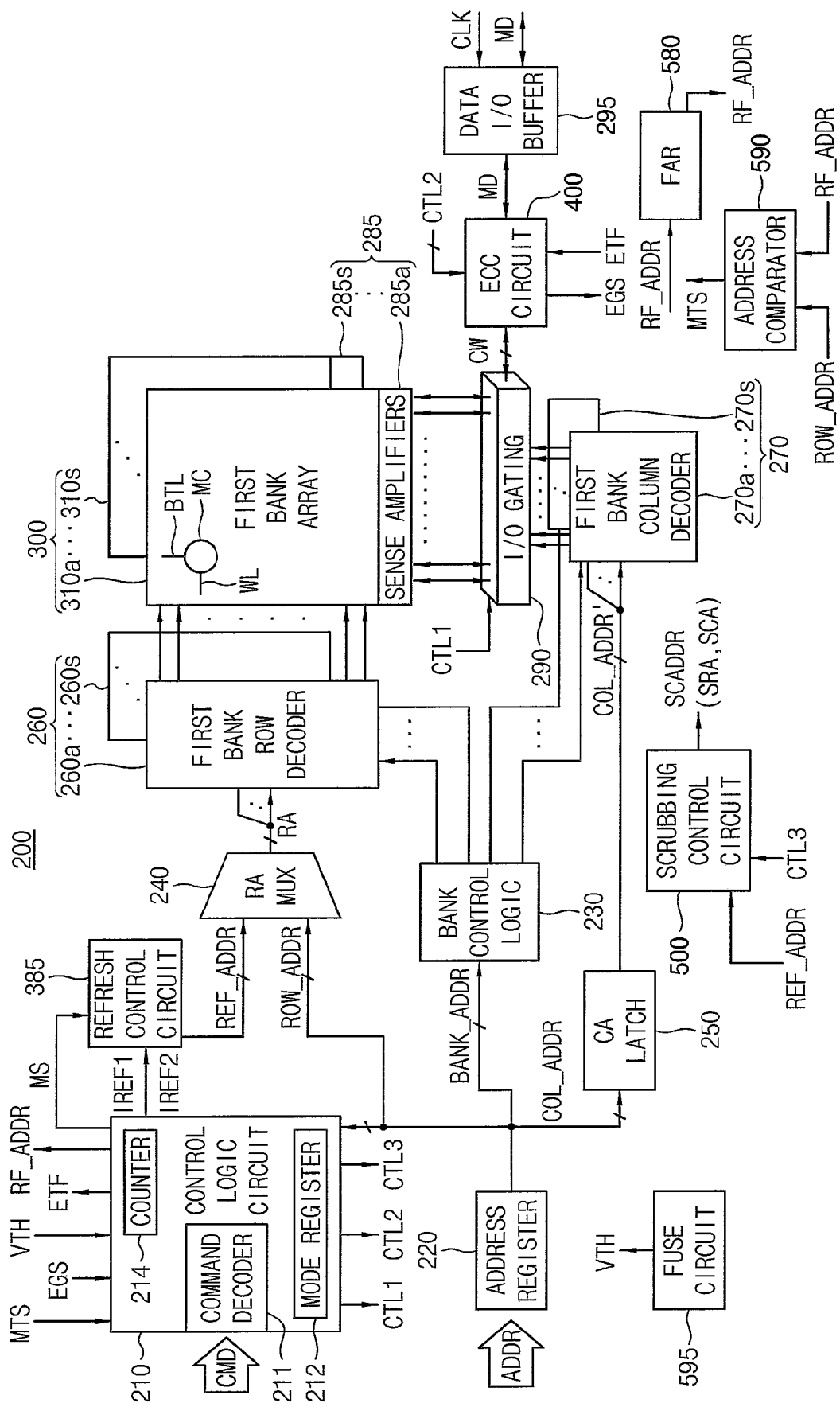
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 may include the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an input/output (I/O) gating circuit 290, the ECC circuit 400, the scrubbing control circuit 500, a data I/O buffer 295, the fault address register 580, an address comparator 590 and a fuse circuit 595.

The memory cell array 300 may include a plurality of bank arrays 310*a*~310*s*. The row decoder 260 may include a plurality of bank row decoders 260*a*~260*s* respectively coupled to the plurality of bank arrays 310*a*~310*s*, the column decoder 270 includes a plurality of bank column decoders 270*a*~270*s* respectively coupled to the plurality of bank arrays 310*a*~310*s*, and the sense amplifier unit 285 includes a plurality of sense amplifiers 285*a*~285*s* respectively coupled to the plurality of bank arrays 310*a*~310*s*.

The plurality of bank arrays 310*a*~310*s*, the plurality of bank row decoders 260*a*~260*h*, the plurality of bank column decoders 270*a*~270*h* and the plurality of sense amplifiers 285*a*~285*s* may form a plurality of banks. Each of the plurality of bank arrays 310*a*~310*s* may include a plurality of volatile memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the plurality of bank row decoders 260*a*~260*s* corresponding to the bank address BANK_ADDR may be activated in response to the bank control signals, and one of the plurality of bank column decoders 270*a*~270*s* corresponding to the bank address BANK_ADDR may be activated in response to the bank control signals.

The row address multiplexer 240 may receive the row address ROW_ADDR from the address register 220, and receives a refresh row address REF_ADDR from the refresh control circuit 385. The row address multiplexer 240 may selectively output the row address ROW_ADDR or the refresh row address REF_ADDR as a row address RA. The row address RA that is output from the row address multiplexer 240 may be applied to the plurality of bank row decoders 260*a*~260*h*.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 385 whenever the control logic circuit 210 receives the auto refresh command.

When the command CMD from the memory controller 100 corresponds to a self-refresh entry command, the control logic circuit 210 may apply the second refresh control signal IREF2 to the refresh control circuit 385 and the second refresh control signal IREF2 is activated from a time point when the control logic circuit 210 receives the self-refresh entry command to a time point when control logic circuit 210 receives a self-refresh exit command. The refresh control circuit 385 may sequentially increase or decrease the refresh row address REF_ADDR in response to receiving the first refresh control signal IREF1 or during the second refresh control signal IREF2 is activated.

The activated one of the plurality of bank row decoders 260*a*~260*s*, by the bank control logic 230, may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and temporarily stores the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the plurality of bank column decoders 270*a*~270*s*.

The activated one of the plurality of bank column decoders 270*a*~270*s* may activate a sense amplifier corresponding to the bank address BANK_ADDR and the column address COL_ADDR' through the I/O gating circuit 290.

The I/O gating circuit 290 may include a circuitry for gating input/output data, and may further include input data mask logic, read data latches for storing data that is output from the plurality of bank arrays 310a~310s, and write drivers for writing data to the plurality of bank arrays 310a~310s.

Codeword CW read from one bank array of the plurality of bank arrays 310a~310s may be sensed by a sense amplifier coupled to the one bank array from which the data is to be read, and is stored in the read data latches of the I/O gating circuit 290. The codeword CW stored in the read data latches may be provided to the memory controller 100 via the data I/O buffer 295 after ECC decoding is performed on the codeword CW by the ECC circuit 400.

The main data MD to be written in one bank array of the plurality of bank arrays 310a~310s may be provided to the data I/O buffer 295 from the memory controller 100, may be provided to the ECC circuit 400 from the data I/O buffer 295, the ECC circuit 400 may perform an ECC encoding on the main data MD to generate parity data, the ECC circuit 400 may provide the main data MD and the parity data to the I/O gating circuit 290 and the I/O gating circuit 290 may write the main data MD and the parity data in a sub-page of the target page in one bank array through the write drivers.

The data I/O buffer 295 may provide the main data MD from the memory controller 100 to the ECC circuit 400 in a write operation of the semiconductor memory device 200, based on the clock signal CLK and may provide the main data MD from the ECC circuit 400 to the memory controller 100 in a read operation of the semiconductor memory device 200.

The ECC circuit 400 may perform an ECC decoding on a codeword read from a sub-page of the target page and may provide an error generation signal EGS to the control logic circuit 210 when the at least one error bit is detected in the codeword.

The scrubbing control circuit 500 may count the refresh row address REF_ADDR which sequentially changes and may output a normal scrubbing address SCADDR whenever the scrubbing control circuit 500 counts N refresh row addresses. Here, N is a natural number equal to or greater than three. The normal scrubbing address SCADDR may include a scrubbing row address SRA and a scrubbing column address SCA. The scrubbing control circuit 500 may provide the scrubbing row address SRA and the scrubbing column address SCA to the row decoder 260 and the column decoder 270, respectively.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

The control logic circuit 210 may further include a counter 214 that counts the error generation signal EGS. The counter 214 may count the error generation signal EGS in a scrubbing operation on the first memory cell row, the control logic circuit 210 may compare a number of error occurrences (i.e., the counted error generation signal) with a reference value VTH and may provide the ECC circuit 400 with an error threshold flag ETF when the number of error occurrences is equal to or greater than the reference value VTH.

The control logic circuit 210 may store a row address of the first memory cell row in the fault address register 580 as a row fault address RF_ADDR in response to the number of error occurrences in the first memory cell row being equal to or greater than the reference value VTH. The control logic circuit 210 may halt an operation of the counter 214 when the number of error occurrences in the first memory cell row is equal to or greater than the reference value VTH. The control logic circuit 210 may include a comparator that compares the number of error occurrences with the reference value VTH and outputs the error threshold flag ETF which is activated when the number of error occurrences is equal to or greater than the reference value VTH. The reference value VTH may be K and K is a natural number equal to or greater than two.

In addition, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290, a second control signal CTL2 to control the ECC circuit 400, and a third control signal CTL3 to control the scrubbing control circuit 500. In addition, the control logic circuit 210 may provide the refresh control circuit 385 with a mode signal MS associated with a refresh period. The control logic circuit 210 may generate the mode signal MS based on a temperature signal (not shown) representing an operating temperature of the semiconductor memory device 200.

The fuse circuit 595 may store the reference value VTH and may provide the reference value VTH to the control logic circuit 210. The fuse circuit 595 may vary the reference value VTH by programming.

The address comparator 590 may compare a row address ROW_ADDR of the access address ADDR from the memory controller 100 with the row fault address RF_ADDR stored in the fault address register 580 to provide the control logic circuit 210 with a match signal MTS based on a result of the comparison (for example, when the row address ROW_ADDR matches the row fault address RF_ADDR). The control logic circuit 210 may control the ECC circuit 400 to skip ECC decoding on a memory cell row designated by the row address ROW_ADDR in response to the match signal MTS.

Figure 3:
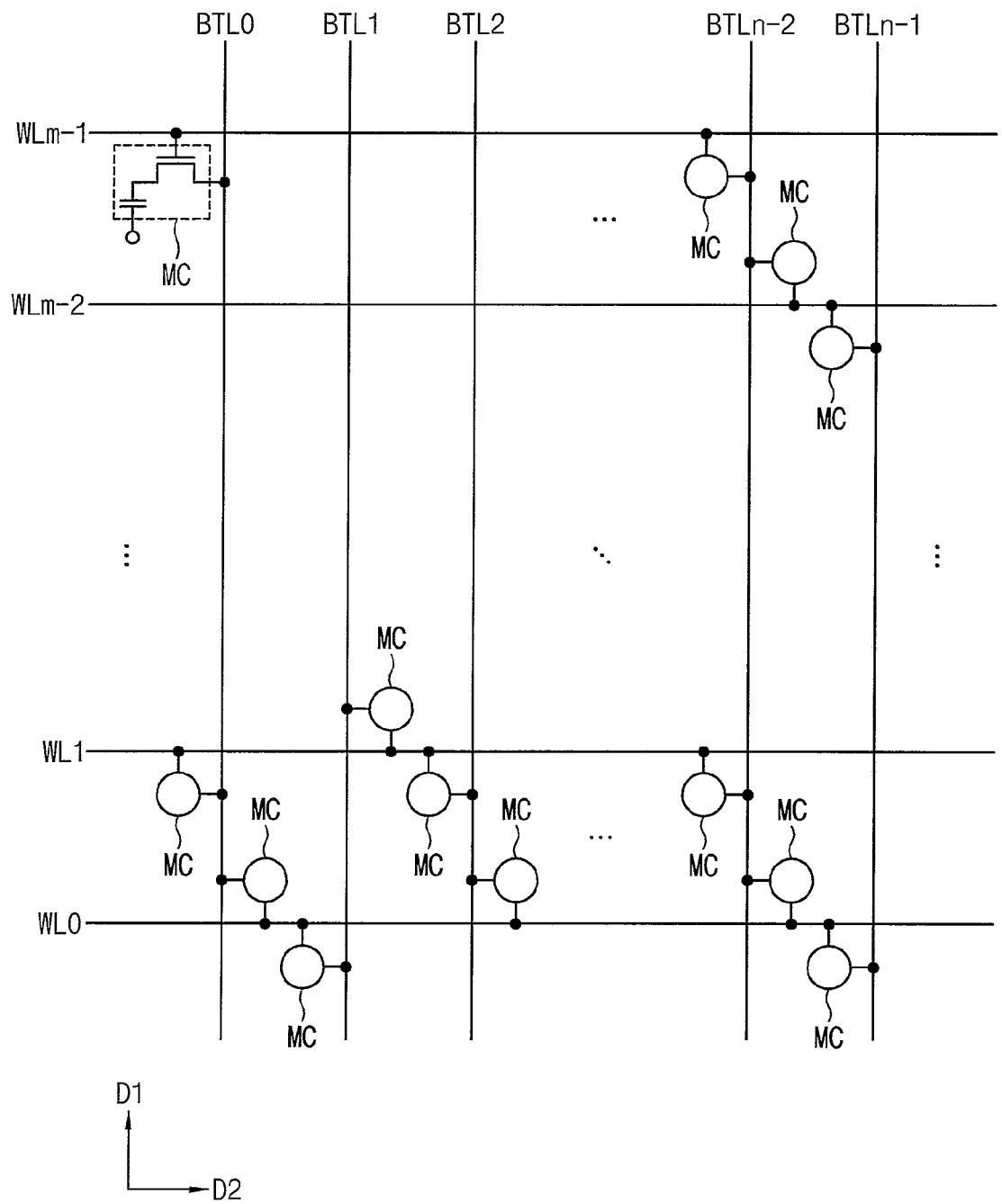
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310a includes a plurality of word-lines WL0~WLm (m is a natural number greater than two), a plurality of bit-lines BTL0~BTLn (n is a natural number greater than two), and a plurality of volatile memory cells MCs disposed at intersections between the word-lines WL0~WLm and the bit-lines BTL0~BTLn. Each of the memory cells MCs includes a cell transistor coupled to each of the word-lines WL0~WLm and each of the bit-lines BTL0~BTLn and a cell capacitor coupled to the cell transistor. Each of the memory cells MCs may have a DRAM cell structure. The bit-lines BTL0~BTLn extend in a first direction D1 and the word-lines WL0~WLm in a second direction D2.

Figure 4:
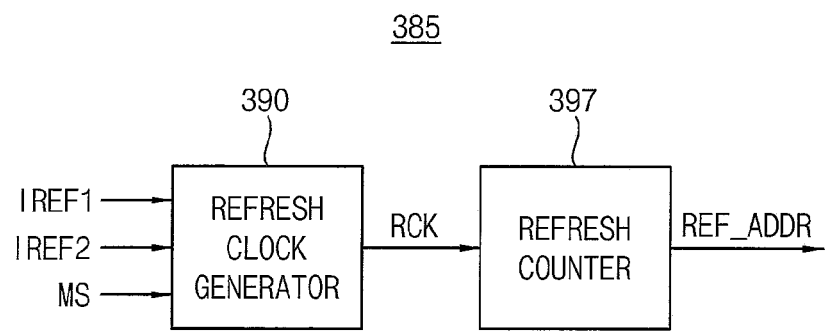
FIG. 4 is a block diagram illustrating the refresh control circuit in the semiconductor memory device of FIG. 2 according to example embodiments.

FIG. 4 is a block diagram illustrating an example of the refresh control circuit in the semiconductor memory device of FIG. 2 according to example embodiments.

Referring to FIG. 4, the refresh control circuit 385 may include a refresh clock generator 390 and a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or during the second refresh control signal IREF2 is activated.

The refresh counter 397 may generate the refresh row address REF_ADDR designating sequentially the memory cell rows by performing counting operation at the period of the refresh clock signal RCK.

Figure 5:
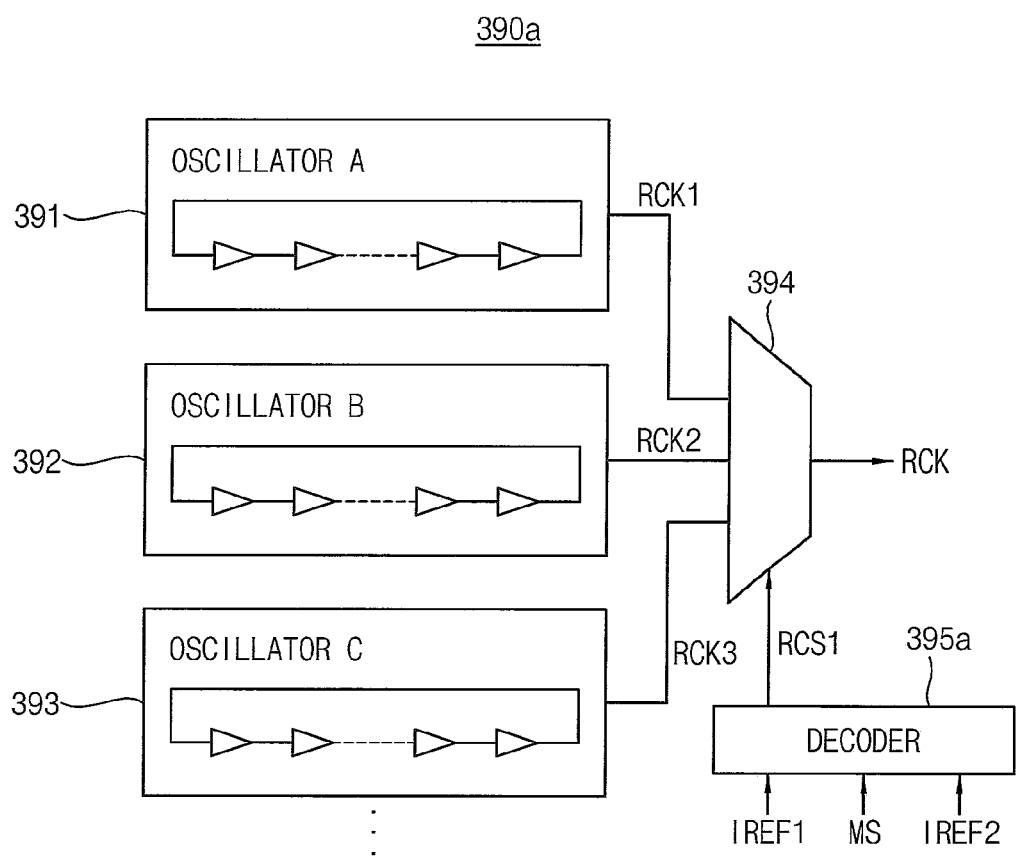
FIG. 5 is a circuit diagram illustrating an example of the refresh clock generator shown in FIG. 4 according to example embodiments.

FIG. 5 is a circuit diagram illustrating an example of the refresh clock generator shown in FIG. 4 according to example embodiments.

Referring to FIG. 5, a refresh clock generator 390*a* may include a plurality of oscillators 391, 392 and 393, a multiplexer 394 and a decoder 395*a*. The decoder 395*a* may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods from each other. The multiplexer 394 selects one of the refresh clock signals RCK1, RCK2 and RCK3 to provide the refresh clock signal RCK in response to the clock control signal RCS1.

Figure 6:
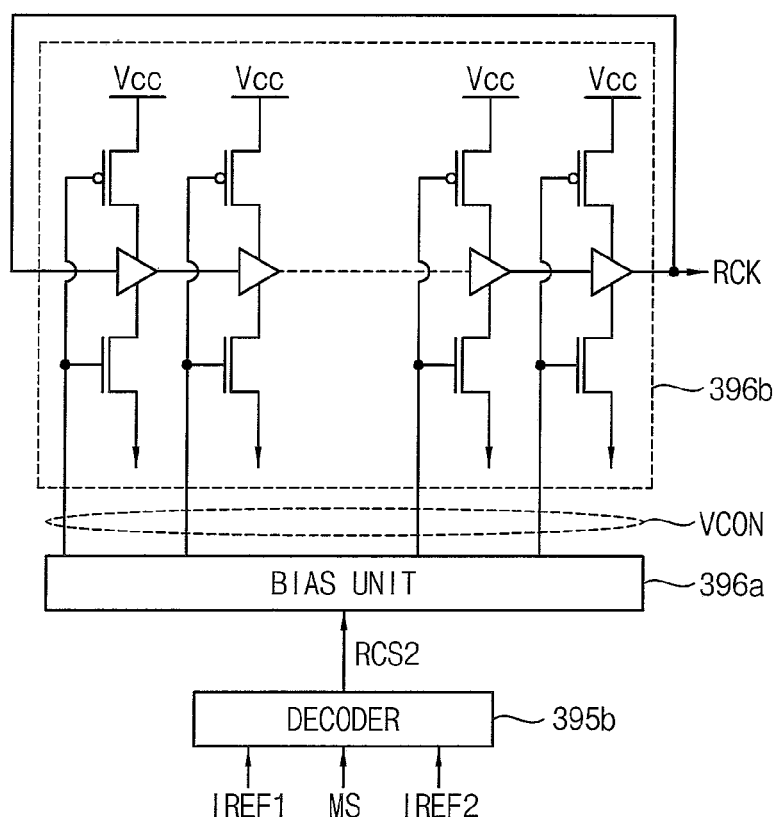
FIG. 6 is a circuit diagram illustrating another example of the refresh clock generator in FIG. 4 according to example embodiments.

FIG. 6 is a circuit diagram illustrating another example of the refresh clock generator in FIG. 4 according to example embodiments.

Referring to FIG. 6, a refresh clock generator 390*b* may include a decoder 395*b*, a bias unit 396*a* and an oscillator 396*b*. The decoder 395*b* may decode the first refresh control signal IREF1, the second refresh control signal IREF2 and the mode signal MS to output a clock control signal RCS2. The bias unit 396*a* generates a control voltage VCON in response to the clock control signal RCS2. The oscillator 396*b* generates the refresh pulse signal RCK having a variable period, according to the control voltage VCON.

Figure 7:
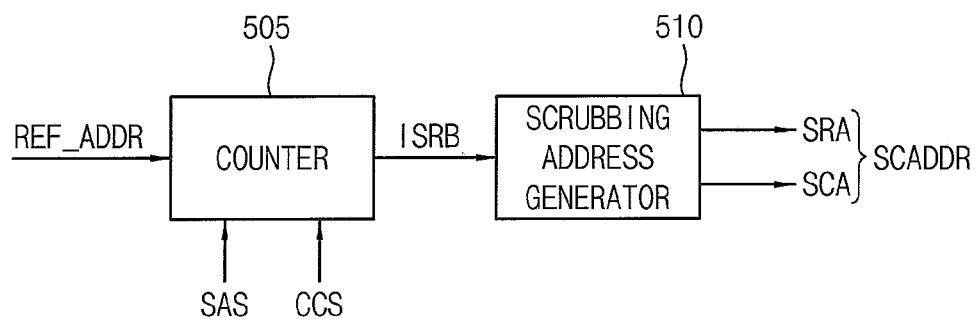
FIG. 7 is a block illustrating an example of the scrubbing control circuit in the semiconductor memory device of FIG. 2 according to example embodiments.

FIG. 7 is a block illustrating an example of the scrubbing control circuit in the semiconductor memory device of FIG. 2 according to example embodiments.

Referring to FIG. 7, the scrubbing control circuit 500 may include a counter 505, and a scrubbing address generator 510.

The counter 505 counts the refresh row address REF_ADDR and generates an internal scrubbing signal ISRB which is activated during a first interval when the counter 505 counts the refresh row address REF_ADDR by a number designated by a counting control signal CCS. The first interval may correspond to a time interval for refreshing one memory cell row. The counter 505 may change the number designated by the counting control signal CCS in response to a scrubbing accelerated signal SAS. For example, the counter 505 may reduce the number designated by the counting control signal CCS when the SAS indicates the accelerated scrubbing mode.

The scrubbing address generator 510 generates a normal scrubbing address SCADDR associated with a normal scrubbing operation for codewords in each of the memory cell rows, which gradually changes in a first scrubbing mode, in response to the internal scrubbing signal ISRB.

The normal scrubbing address SCADDR includes a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

Figure 8:
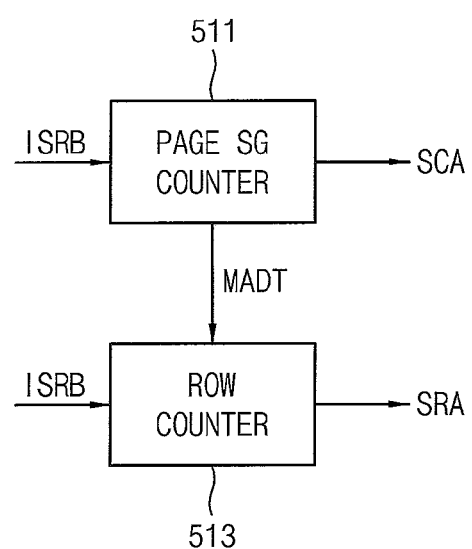
FIG. 8 is a block diagram illustrating the scrubbing address generator in the scrubbing control circuit of FIG. 7 according to example embodiments.

FIG. 8 is a block diagram illustrating the scrubbing address generator in the scrubbing control circuit of FIG. 7 according to example embodiments.

Referring to FIG. 8, the scrubbing address generator 510 may include a page segment counter 511 and a row counter 513.

The page segment counter 511 increases the scrubbing column address SCA by one during the internal scrubbing signal ISRB is activated and actives a maximum address detection signal MADT with being reset whenever the scrubbing column address SCA reaches its maximum value, in response to the internal scrubbing signal. The page segment counter 511 provides the maximum address detection signal MADT to the row counter 513.

The row counter 513 starts counting operation one receiving the internal scrubbing signal ISRB initially and increases the scrubbing row address SRA by one whenever the activated maximum address detection signal MADT receives in response to the internal scrubbing signal ISRB. Since the internal scrubbing signal ISRB is activated during the first interval while a refresh operation is performed on one memory cell row, the page segment counter 511 may generate the scrubbing column address SCA associated with codewords in one page during the first interval.

Figure 9:
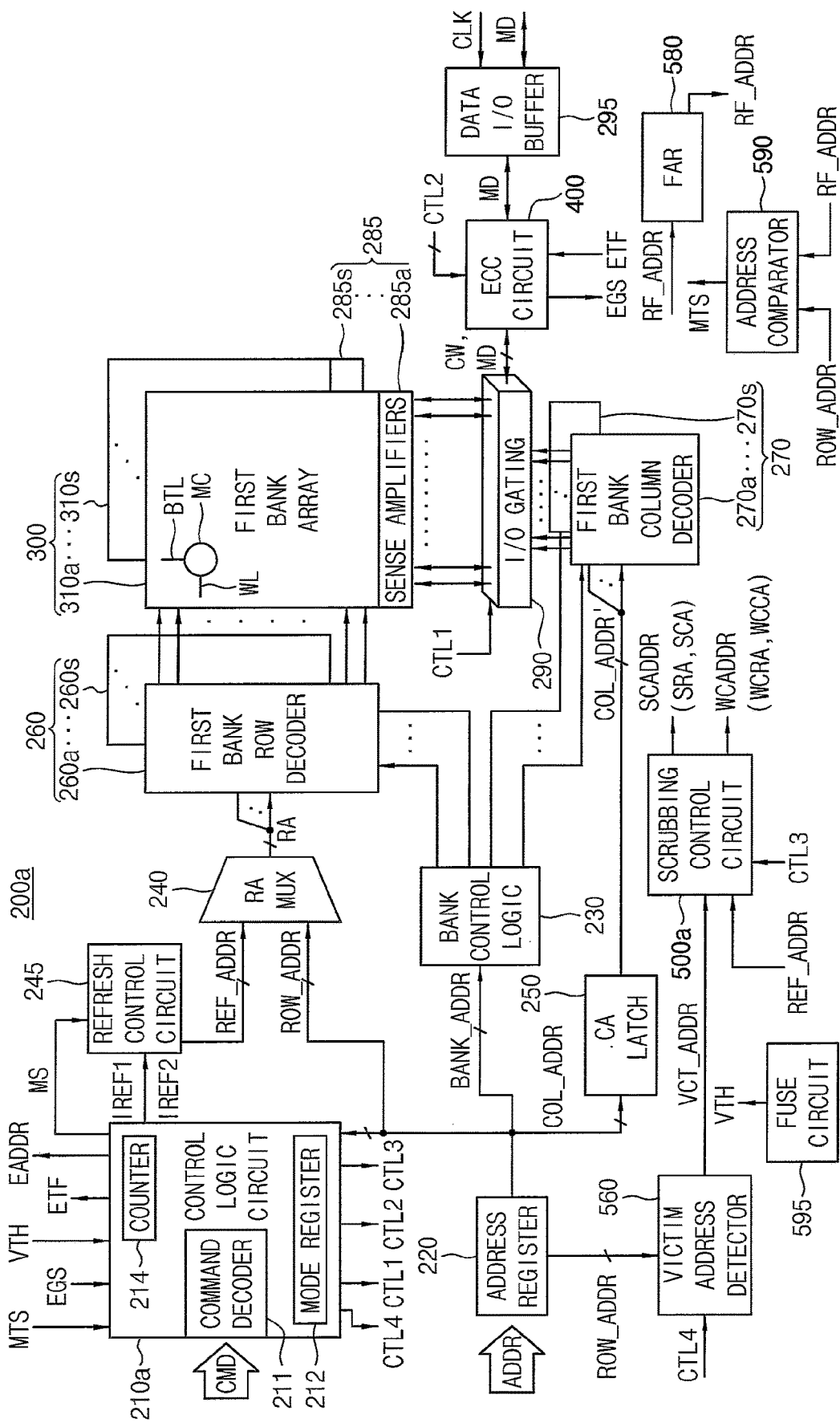
FIG. 9 is a block diagram illustrating another example of the semiconductor memory device in FIG. 1 according to example embodiments.

FIG. 9 is a block diagram illustrating another example of the semiconductor memory device in FIG. 1 according to example embodiments.

A semiconductor memory device 200*a* of FIG. 9 differs from the semiconductor memory device 200 of FIG. 2 in that the semiconductor memory device 200*a* further includes a victim address detector 560 and a scrubbing control circuit 500*a* outputs a weak codeword address WCADDR in a second scrubbing mode.

Referring to FIG. 9, a control logic circuit 210*a* may further generate a fourth control signal CTL 4 for controlling the victim address detector 560.

The victim address detector 560 may count a number of accesses to a first memory region in the memory cell array 300 to generate at least one victim address VCT_ADDR designating at least one adjacent memory region adjacent to the first memory region when the number of the counted accesses to the first memory region reaches a reference number of times during a reference interval. The victim address VCT_ADDR may be stored in an address storing table of the scrubbing control circuit 500*a*.

The scrubbing control circuit 500*a* may provide the scrubbing row address SRA and the scrubbing column address SCA to the row decoder 260 and the column decoder 270, respectively in a first scrubbing mode. The scrubbing control circuit 500*a*, in a second scrubbing mode, may output an address of codeword associated with the victim address VCT_ADDR stored in an address storing table therein as a weak codeword address WCADDR. The weak codeword address WCADDR may include a weak codeword row address WCRA and a weak codeword column address WCCA. The scrubbing control circuit 500*a* may provide the weak codeword row address WCRA and the weak codeword column address WCCA to the row decoder 260 and the column decoder 270, respectively in the second scrubbing mode.

Figure 10:
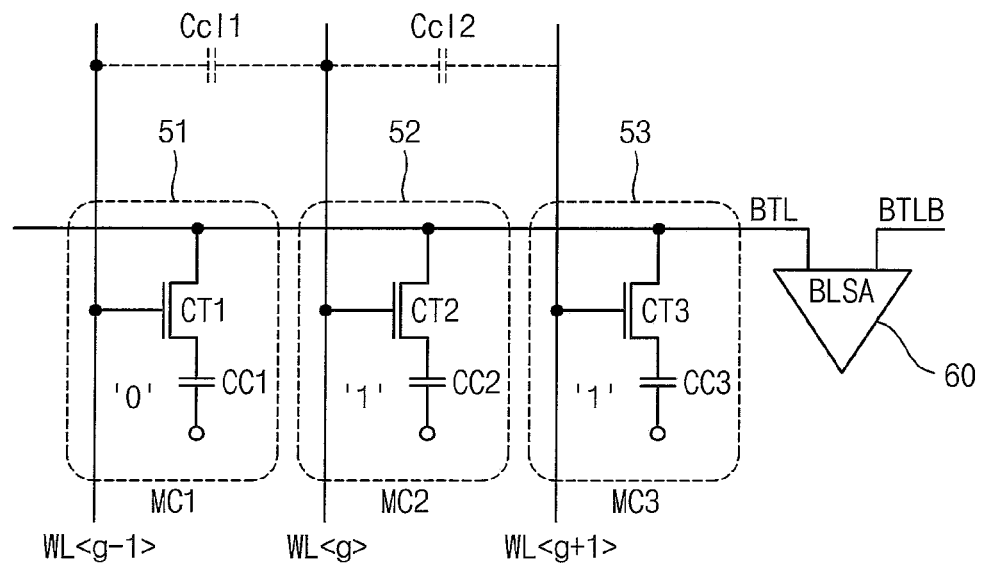
FIG. 10 is a circuit diagram illustrating disturbance between memory cells of a semiconductor memory device.

FIG. 10 is a circuit diagram illustrating disturbance between memory cells of a semiconductor memory device.

Referring to FIG. 10, a part of the semiconductor memory device 200a includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 10, the word-lines WL<g−1> and WL<g+1> are located adjacent to the word-line WL<g>. The memory cell 51 includes an access transistor CT1 and a cell capacitor CC1. A gate terminal of the access transistor CT1 is connected to the word-line WL<g−1> and its one terminal is connected to the bit-line BTL. The memory cell 52 includes an access transistor CT2 and a cell capacitor CC2. A gate terminal of the access transistor CT2 is connected to the word-line WL<g> and its one terminal is connected to the bit-line BTL. Also, the memory cell 53 includes an access transistor CT3 and a cell capacitor CC3. A gate terminal of the access transistor ST3 is connected to the word-line WL<g+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<g>. Then, due to capacitive coupling effect, a voltage of adjacent word-lines WL<g−1> and WL<g+1> rises even when no select voltage is applied to the adjacent word-lines WL<g−1> and WL<g+1>. Such capacitive coupling is indicated with parasitic capacitances Ccl1 and Ccl2.

During no refresh operation, when the word-line WL<g> is accessed repeatedly, charges stored in the cell capacitors CC1 and CC3 of the memory cells 51 and 53 connected to the word-lines WL<g−1> and WL<g+1> may leak gradually. In this case, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 11:
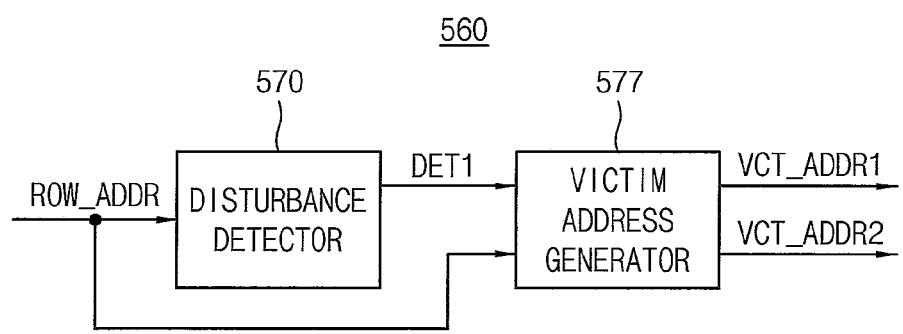
FIG. 11 is a block diagram illustrating an example of the victim address detector in the semiconductor memory device of FIG. 9 according to example embodiments.

FIG. 11 is a block diagram illustrating an example of the victim address detector in the semiconductor memory device of FIG. 9 according to example embodiments.

Referring to FIG. 11, the victim address detector 560 may include a disturbance detector 570 and a victim address generator 577.

The disturbance detector 570 may count a number of accesses to a first memory region (e.g., at least one memory cell row) based on the row address ROW_ADDR and may generate a first detection signal DET1 when the number of the counted accesses reaches a reference value during a reference (or predetermined) interval.

The victim address generator 577 may generate the at least one of victim addresses VCT_ADDR1 and VCT_ADDR2 in response to the first detection signal DET1. The at least one of victim addresses VCT_ADDR1 and VCT_ADDR2 may be a row address designating a second memory region or a third memory region which are located adjacent to the first memory region. The victim address generator 577 may provide the at least one of victim addresses VCT_ADDR1 and VCT_ADDR2 to an address storing table in the scrubbing control circuit 500a.

Figure 12:
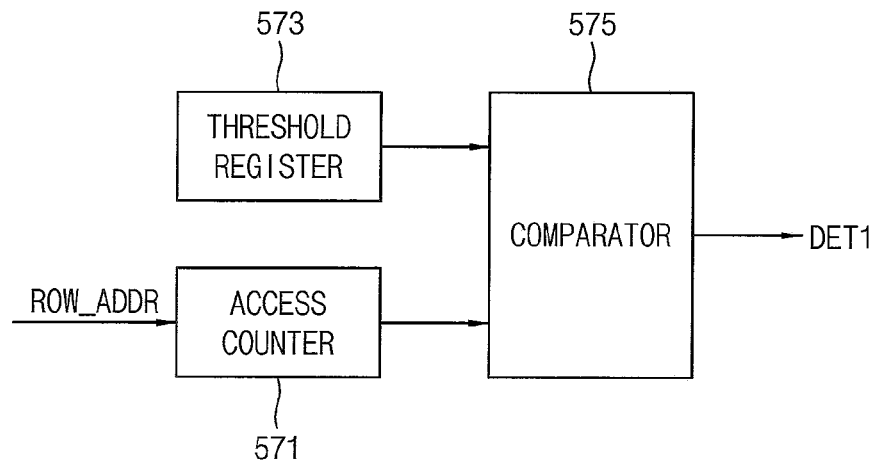
FIG. 12 is a block diagram illustrating the disturbance detector in the victim address detector of FIG. 11.

FIG. 12 is a block diagram illustrating the disturbance detector in the victim address detector of FIG. 11.

Referring to FIG. 12, the disturbance detector 570 may include access counter 571, a threshold register 573 and a comparator 575.

The access counter 571 may count a number of accesses to a specified address (or a specified memory region) based on the row address ROW_ADDR. For example, the access counter 571 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 573 may store a maximum disturbance occurrence count that guarantees the reliability of data in a specific word-line or a memory unit. For example, a threshold (or a reference value) on one word-line may be stored in the threshold register 573. Alternatively, a threshold on one word line group, one block, one bank unit, or one chip unit may be stored in the threshold register 573.

The comparator 575 may compare the reference value stored in the threshold register 573 to the number of accesses to a specific memory region counted by the access counter 571. If there is a memory region where the counted number of accesses reaches the reference value, the comparator 575 generates the first detection signal DET1. The comparator 575 provides the first detection signal DET1 to the victim address generator 577.

Figure 13:
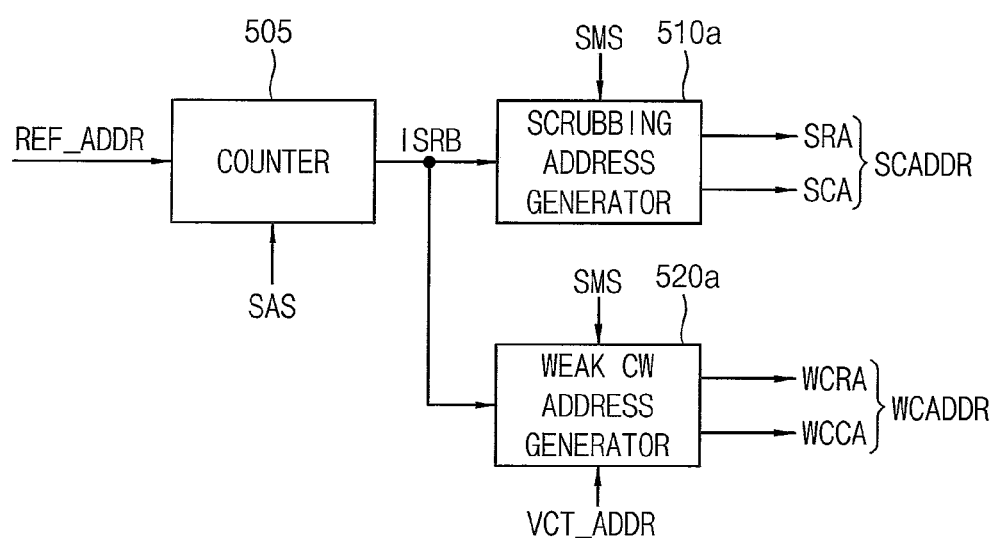
FIG. 13 is a block illustrating an example of the scrubbing control circuit in the semiconductor memory device of FIG. 9 according to example embodiments.

FIG. 13 is a block illustrating an example of the scrubbing control circuit in the semiconductor memory device of FIG. 9 according to example embodiments.

Referring to FIG. 13, the scrubbing control circuit 500a may include a counter 505, a scrubbing address generator 510a and a weak codeword address generator 520a.

Operations of the counter 505, a scrubbing address generator 510a are substantially similar to operations of the counter 505 and the scrubbing address generator 510 in FIG. 7. The scrubbing address generator 510a further receives a scrubbing mode signal SMS and generates the normal scrubbing address SCADDR in the first scrubbing mode.

The weak codeword address generator 520a generates a weak codeword address WCADDR associated with a weak scrubbing operation associated with weak codewords in the bank array in the second scrubbing mode, in response to the internal scrubbing signal ISRB and the scrubbing mode signal SMS. The weak codeword address WCADDR includes a weak codeword row address WCRA and a weak codeword column address WCCA.

The scrubbing mode signal SMS indicates the first scrubbing mode when the scrubbing mode signal SMS has a first logic level and indicates the second scrubbing mode when the scrubbing mode signal SMS has a second logic level. The scrubbing mode signal SMS may be included in the third control signal CTL3. The weak codeword address generator 520a provides the weak codeword row address WCRA to the corresponding row decoder and provides the weak codeword column address SCA to the corresponding column decoder.

The weak codeword address generator 520a may include an address storing table therein and the address storing table may store addresses of codewords associated with the victim address VCT_ADDR. The scrubbing operation performed based on the weak codeword address WCADDR may be referred to as a target scrubbing operation because the scrubbing operation is performed on the weak codewords.

Figure 14:
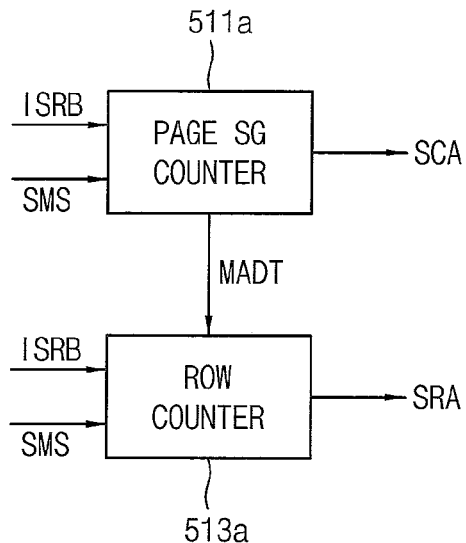
FIG. 14 is a block diagram illustrating the scrubbing address generator in the scrubbing control circuit of FIG. 13 according to example embodiments.

FIG. 14 is a block diagram illustrating the scrubbing address generator in the scrubbing control circuit of FIG. 13 according to example embodiments.

Referring to FIG. 14, the scrubbing address generator 510a may include a page segment counter 511a and a row counter 513a.

The page segment counter 511a increases the scrubbing column address SCA by one during the internal scrubbing signal ISRB is activated in the first scrubbing mode and actives a maximum address detection signal MADT with being reset whenever the scrubbing column address SCA reaches its maximum value, in response to the internal scrubbing signal ISRB and the scrubbing mode signal SMS. The page segment counter 511a provides the maximum address detection signal MADT to the row counter 513a.

The row counter 513a starts counting operation one receiving the internal scrubbing signal ISRB initially and increases the scrubbing row address SRA by one whenever the activated maximum address detection signal MADT in response to the internal scrubbing signal ISRB and the scrubbing mode signal SMS.

Figure 15:
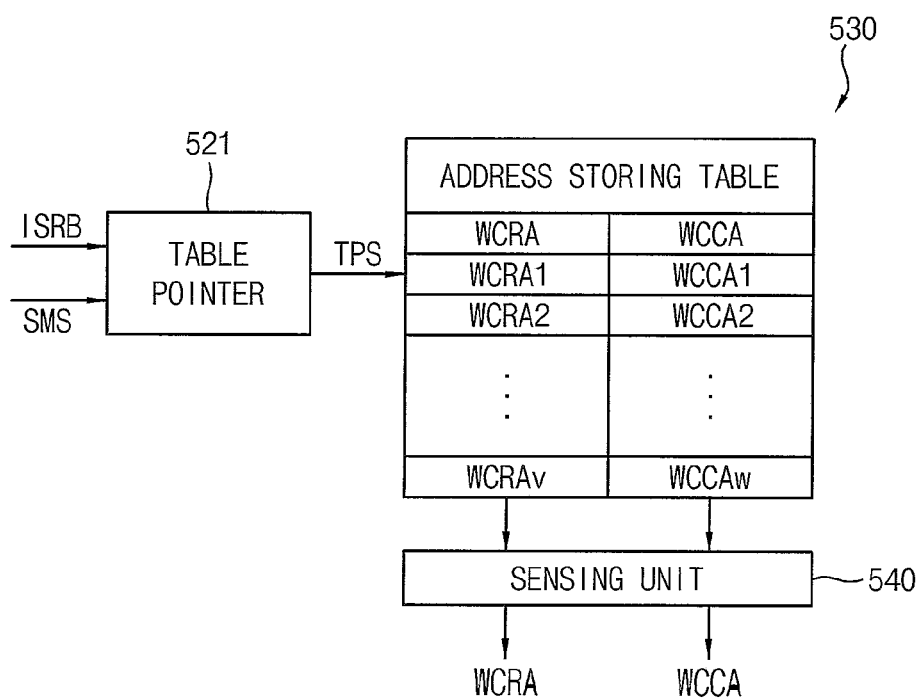
FIG. 15 illustrates the weak codeword address generator in the scrubbing control circuit of FIG. 13 according to example embodiments.

FIG. 15 illustrates the weak codeword address generator in the scrubbing control circuit of FIG. 13 according to example embodiments.

Referring to FIG. 15, the weak codeword address generator 520a may include a table pointer 521, an address storing table 530 and a sensing unit 540.

The address storing table 530 stores address information WCRA1~WCRAv and WCCA1~WCCAw (w is a natural number greater than v) of weak codewords included in the memory cell array 300.

The weak codewords may be all or some of a weak page including a number of error bit greater than a reference value among pages in bank arrays of the memory cell array. In addition, the weak codewords may be codewords of neighbor pages adjacent to the intensively accessed memory region.

The table pointer 521 may generate a pointer signal TPS which provide location information for the address storing table 530 in response to the internal scrubbing signal ISRB and the scrubbing mode signal SMS during the first interval in the second scrubbing mode, and provides the pointer signal TPS to the address storing table 530. The address storing table 530 may include a nonvolatile storage. The at least one of victim addresses VCT_ADDR1 and VCT_ADDR2 provided from the victim address generator 577 in FIG. 11 may be stored in the address storing table 530.

The pointer signal TPS gradually increases by a predetermined times during the first interval and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder and provides the weak codeword column address WCCA to a corresponding column decoder.

The control logic circuit 210a may apply different refresh periods to some memory cell rows based on a number of error bits for each of the memory cell rows, which are detected by the scrubbing operation.

Figure 16:
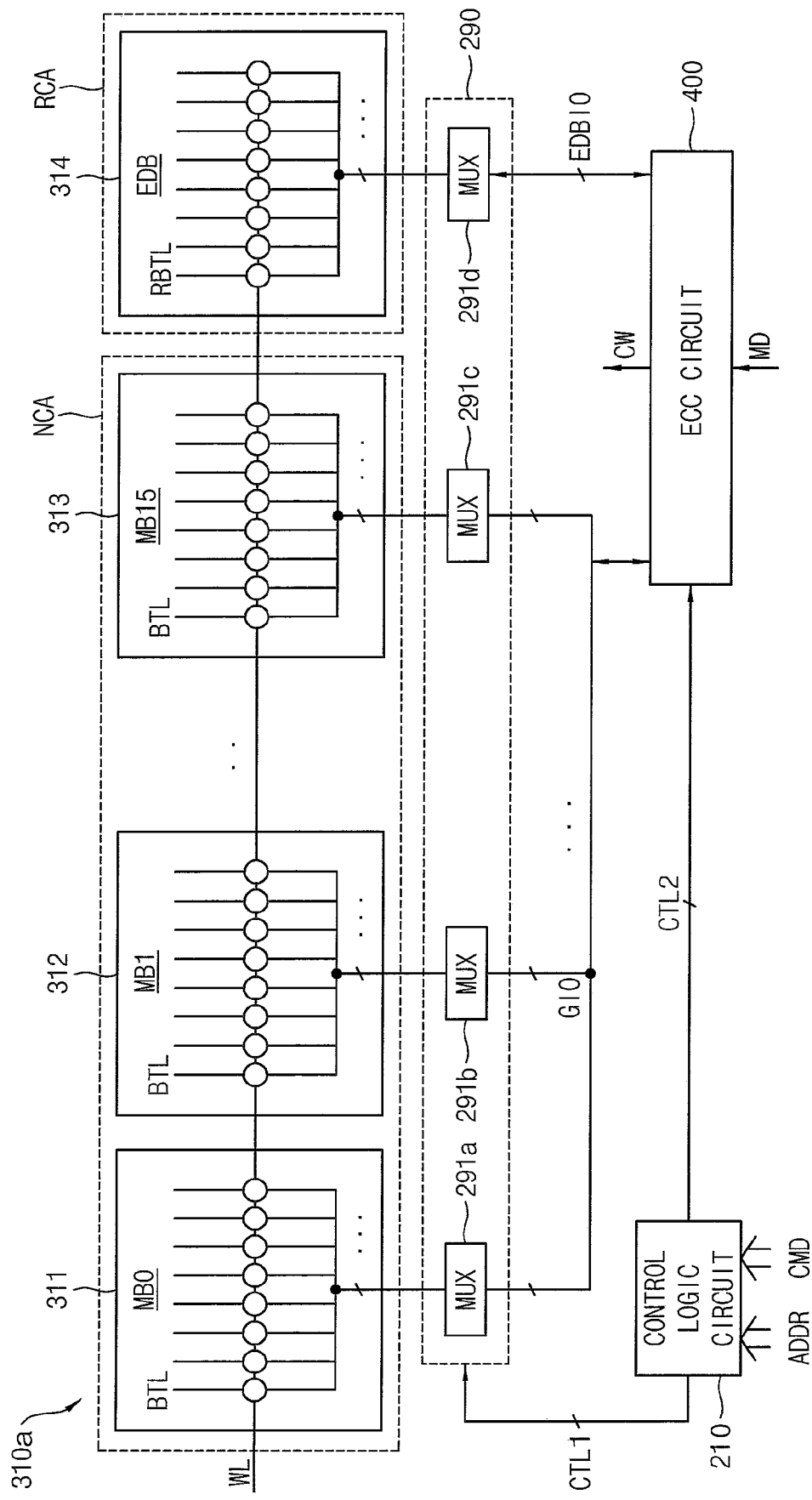
FIG. 16 illustrates a portion of the semiconductor memory device of FIG. 2 in a write operation.

FIG. 16 illustrates a portion of the semiconductor memory device 200 of FIG. 2 or 200a of FIG. 9 in a write operation.

In FIG. 16, the control logic circuit 210, the first bank array 310a, the I/O gating circuit 290, and the ECC circuit 400 are illustrated.

Referring to FIG. 16, the first bank array 310a includes a normal cell array NCA and a redundancy cell array RCA. The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC circuit 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC circuit 400.

When the command CMD is a write command, the control logic circuit 210 may provide the second control signal CTL2 to the ECC circuit 400 and the ECC circuit 400 may perform the ECC encoding on the main data MD to generate parity data associated with the main data MD and provides the I/O gating circuit 290 with the codeword CW including the main data MD and the parity data. The control logic circuit 210 may provide the first control signal CTL1 to the I/O gating circuit 290 such that the codeword CW is to be stored in a sub-page of the target page in the first bank array 310a.

Figure 17:
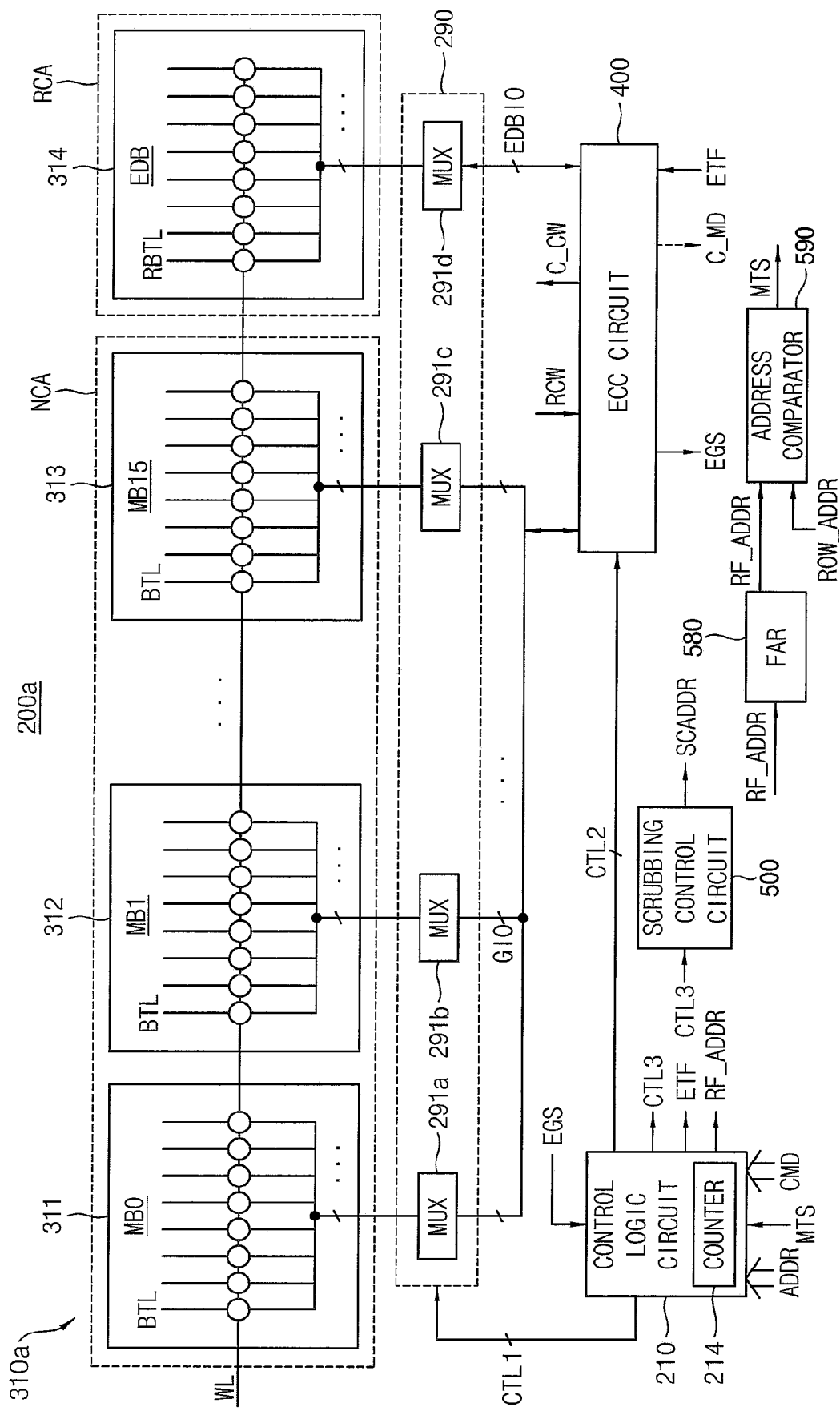
FIG. 17 illustrates a portion of the semiconductor memory device of FIG. 2 in a refresh operation or a read operation.

FIG. 17 illustrates a portion of the semiconductor memory device 200 of FIG. 2 or 200a of FIG. 9 in a refresh operation (scrubbing operation) or a read operation.

In FIG. 17, the control logic circuit 210, the first bank array 310a, the I/O gating circuit 290, the ECC circuit 400, the fault address register 580 and the address comparator 590 are illustrated.

Referring to FIG. 17, when the command CMD is a refresh command to designate a refresh operation, the scrubbing control circuit 500 may generate the scrubbing addresses based on counting the refresh row addresses and the control logic circuit 210 may provide the first control signal CTL1 to the I/O gating circuit 290 such that a read codeword RCW stored in each of sub-pages of the target page in the first bank array 310a is sequentially provided to the ECC circuit 400. For example, the read codeword RCW may include a first parity data and a first main data.

The ECC circuit 400 may perform an error detection and correction operation on the read codeword RCW and may provide the error generation signal EGS to the control logic circuit 210 in response to detecting an error bit during a first interval of the scrubbing operation. The control logic circuit 210 may count the error generation signal EGS (a number of error occurrences) for one page and may determine whether a row fault occurs in the target page based on comparison of the number of error occurrences with the reference value VTH. When the number of error occurrences is equal to or greater than the reference value VTH, the control logic circuit 210 may provide the ECC circuit 400 with the error threshold flag ETF having a high level and may store a row address of the target page in the fault address register 580.

The control logic circuit 210 may write back a corrected codeword C_CW in a corresponding sub-page or may perform an error detection and correction operation on a second memory cell row different from the first memory cell row based on comparison of the number of error occurrences with the reference value VTH. For example, the corrected codeword C_CW may include a second parity data and a second main data. For example, the control logic circuit 210 may control the ECC circuit 400 to skip writing back the corrected codeword C_CW in the corresponding sub-page in response to the number of error occurrences being equal to or greater than the reference value VTH. For example, the control logic circuit 210 may control the ECC circuit 400 to write back the corrected codeword C_CW in the corresponding sub-page in response to the number of error occurrences being greater than zero and smaller than the reference value VTH, during the second interval of the scrubbing operation. For example, the control logic circuit 210 may control the ECC circuit 400 to perform the error detection and correction operation on a plurality of sub-pages in a second memory cell row different from the first memory cell row, in response to the number of error occurrences in the first memory cell row being a zero. The control logic circuit 210 may perform the scrubbing operation on memory cell rows rapidly because the number of error occurrences of most memory cell rows is zero.

When the command CMD corresponds to a read command, the ECC circuit 400 may provide a corrected main data C_MD to the data I/O buffer 295 with skipping of writing back the corrected codeword C_CW. For example, the corrected main data C_MD may include a third main data.

When the command CMD corresponds to a read command after the row fault address RF_ADDR is stored in the fault address register 580, the address comparator 590 may compare the row address ROW_ADDR with the row fault address RF_ADDR and may provide the control logic circuit 210 with the match signal MTS indicating a result of the comparison. When the match signal MTS indicates that the row address ROW_ADDR matches the row fault address RF_ADDR, the control logic circuit 210 may control the ECC circuit 400 to skip an ECC decoding on a memory cell row designated by the row address ROW_ADDR.

Figure 18:
FIG. 18 illustrates an example of the fault address register in the semiconductor memory device of FIG. 2 according to example embodiments.

FIG. 18 illustrates the fault address register in the semiconductor memory device 200 of FIG. 2 or 200a of FIG. 9 according to example embodiments.

Referring to FIG. 18, each of indexes (e.g., entries) Idx11, Idx12, . . . , Idx1u (u is a natural number greater than two) of the fault address register 580 may include information on row fault address RF_ADDR of each of row fault memory cell rows which are determined to have row faults during a first interval of the scrubbing operation. The fault address register 580 includes a plurality of columns 581 and 583.

The column 581 stores row fault address RF_ADDR of each of the row fault memory cell rows and the column 583 stores a number of error occurrences ECNT of each of the row fault memory cell rows. The row fault address RF_ADDR may include a bank group address ('BGA'), a bank address ('BA'), and a row address ('RA') of each of the row fault memory cell rows.

In FIG. 18, it is assumed that a memory cell row is determined to have a row fault when the number of error occurrences ECNT detected during the first interval is equal to or greater than three.

The control logic circuit 210 in FIG. 2 may perform a soft post package repair (PPR) on at least some of the row fault memory cell rows by referring to the fault address register 580. The control logic circuit 210 may perform a soft PPR on the at least some of the row fault memory cell rows by storing (moving) data stored in the at least some of the row fault memory cell rows in a redundancy region of the memory cell array 300. The row fault address RF_ADDR of the at least some of the row fault memory cell rows on which the soft PPR is performed is reset in the fault address register 580 and a row fault address of a new row fault memory cell row may be stored in the fault address register 580.

Figure 19:
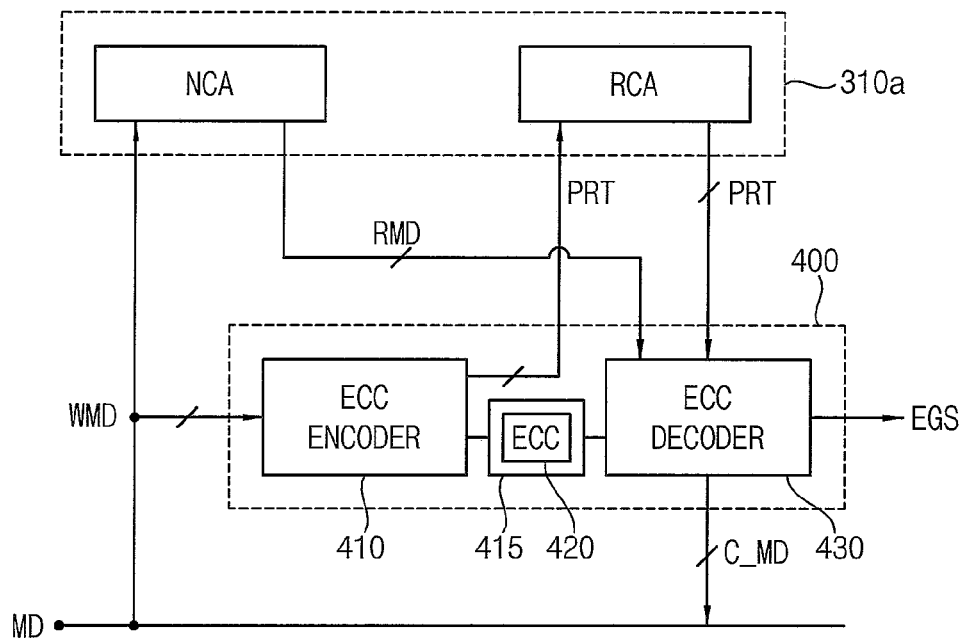
FIG. 19 is a block diagram illustrating an example of the ECC circuit in the semiconductor memory device of FIG. 2 according to example embodiments.

FIG. 19 is a block diagram illustrating an example of the ECC circuit in the semiconductor memory device 200 of FIG. 2 according to example embodiments.

Referring to FIG. 19, the ECC circuit 400 may include an ECC encoder 410, an ECC decoder 430 and a (ECC) memory 415. The memory 415 may store an ECC 420. The ECC 420 may be a single error correction (SEC) code or a single error correction/double error detection (SECDED) code.

The ECC encoder 410 may generate parity data PRT using the ECC 420, associated with a write data WMD to be stored in the normal cell array NCA of the first bank array 310a. The parity data PRT may be stored in the redundancy cell array RCA of the first bank array 310a.

The ECC decoder 430 may perform an ECC decoding on a read data RMD based on the read data RMD and the parity data PRT read from the first bank array 310a using the ECC 420. When the read data RMD includes at least one error bit as a result of the ECC decoding, the ECC decoder 430 may provide the error generation signal EGS to the control logic circuit 210, may selectively correct the error bit in the read data RMD and may write back the corrected codeword C_CW in a scrubbing operation and outputs the corrected main data C_MD in a read operation.

Figure 20:
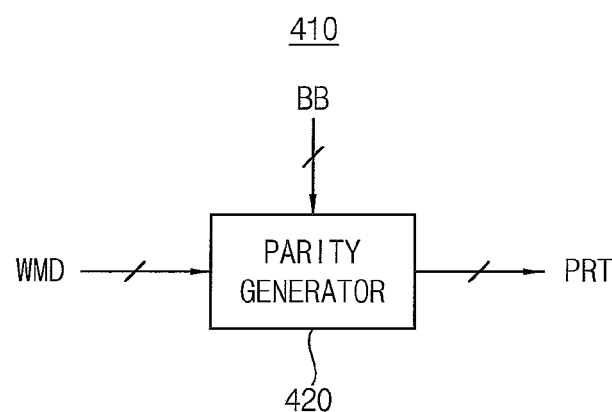
FIG. 20 illustrates an example of the ECC encoder in the ECC circuit of FIG. 19 according to example embodiments.

FIG. 20 illustrates an example of the ECC encoder in the ECC circuit of FIG. 19 according to example embodiments.

Referring to FIG. 20, the ECC encoder 410 may include a parity generator 420. The parity generator 420 may receive write data WMD and basis bit BB and may generate the parity data PRT by performing, for example, an XOR array operation.

Figure 21:
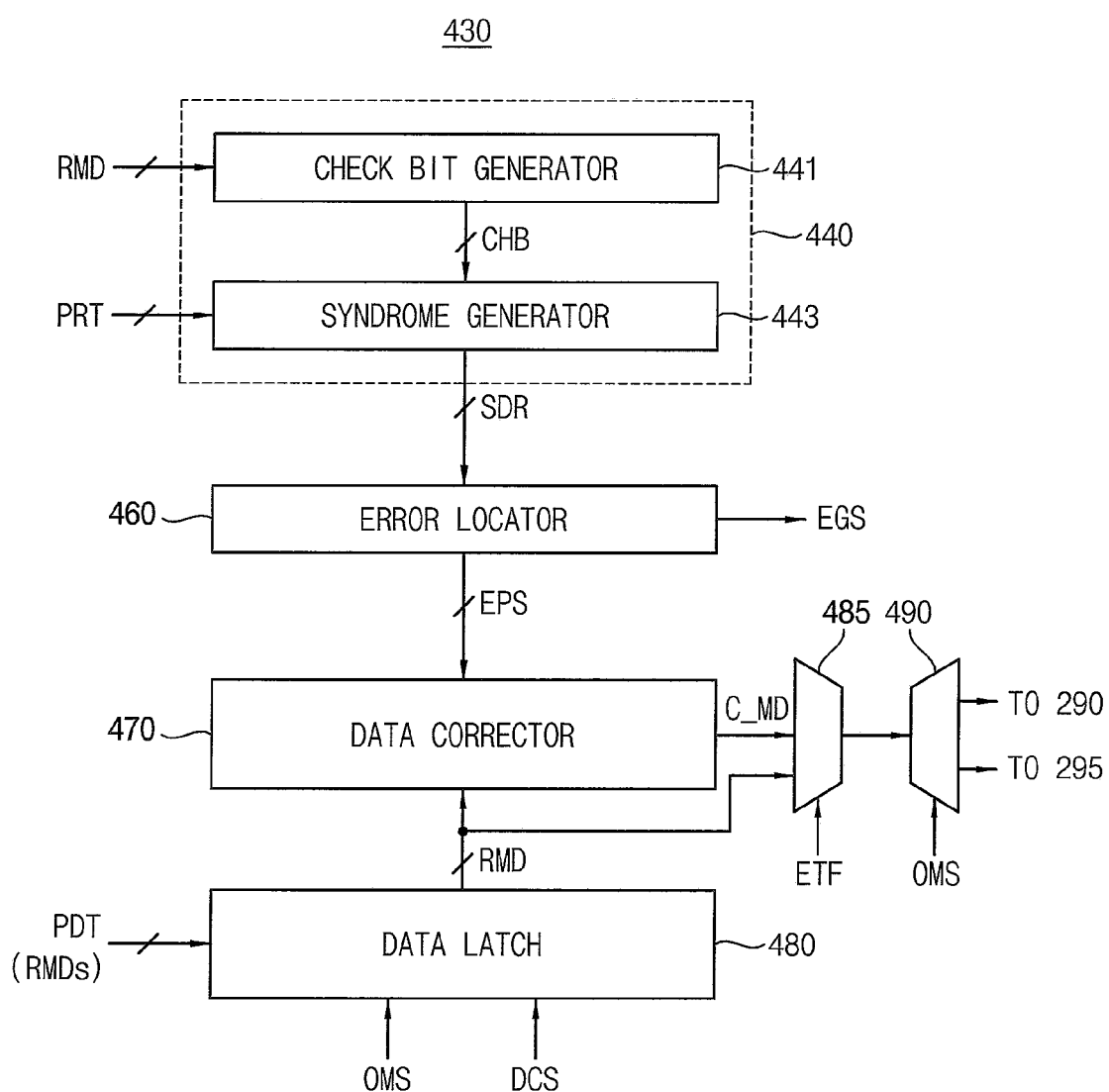
FIG. 21 illustrates an example of the ECC decoder in the ECC circuit of FIG. 19 according to example embodiments.

FIG. 21 illustrates an example of the ECC decoder in the ECC circuit 400 of FIG. 19 according to example embodiments.

Referring to FIG. 21, the ECC decoder 430 may include a syndrome generation circuit 440, an error locator 460, a data corrector 470, a data latch 480, a multiplexer 485 and a demultiplexer 490. The syndrome generation circuit 440 may include a check bit generator 441 and a syndrome generator 443.

The check bit generator 441 may generate check bits CHB based on the read data RMD by performing, an XOR array operation and the syndrome generator 443 may generate a syndrome SDR by comparing corresponding bits of the parity data PRT and the check bits CHB.

The error locator 460 may generate an error position signal EPS indication a position of an error bit in the read data RMD to provide the error position signal EPS to the data corrector 470 when all bits of the syndrome SDR are not 'zero'. In addition, when the read data RMD includes the error bit, the error locator 460 may provide the error generation signal EGS to the control logic circuit 210.

The data latch 480, in a scrubbing operation, may receive page data PDT including a plurality of read data RMDs, may provide the data corrector 470 and the multiplexer 485 with the read data RMD including correctable error bit in a scrubbing operation or may provide the data corrector 470 with the read data RMD without regard to error bit, in a read operation, in response to an operation mode signal OMS and a data control signal DCS. The operation mode signal OMS may designate one of the scrubbing operation and the read operation. The operation mode signal OMS and the data control signal DCS may be included in the second control signal CTL2 in FIG. 2.

The data corrector 470 may receive the read data RMD, may correct the error bit in the read data RMD based on the error position signal EPS when the read data RMD includes the error bit and may output the corrected main data C_MD.

The multiplexer 485 may select one of the read data RMD and the corrected main data C_MD in response to the error threshold flag ETF and may provide the selected one to the demultiplexer 490. For example, when the error threshold flag ETF indicates that the number of error occurrences is equal to or greater than the reference value VTH, the multiplexer 485 may provide the read data RMD to the demultiplexer 490. For example, when the error threshold flag ETF indicates that the number of error occurrences is less than the reference value VTH, the multiplexer 485 may provide the corrected main data C_MD to the demultiplexer 490.

The demultiplexer 490, in response to the operation mode signal OMS, may provide the I/O gating circuit 290 with an output of the multiplexer 485 in the scrubbing operation and may provide the data I/O buffer 295 with the output of the multiplexer 485 in the read operation.

Figure 22A:
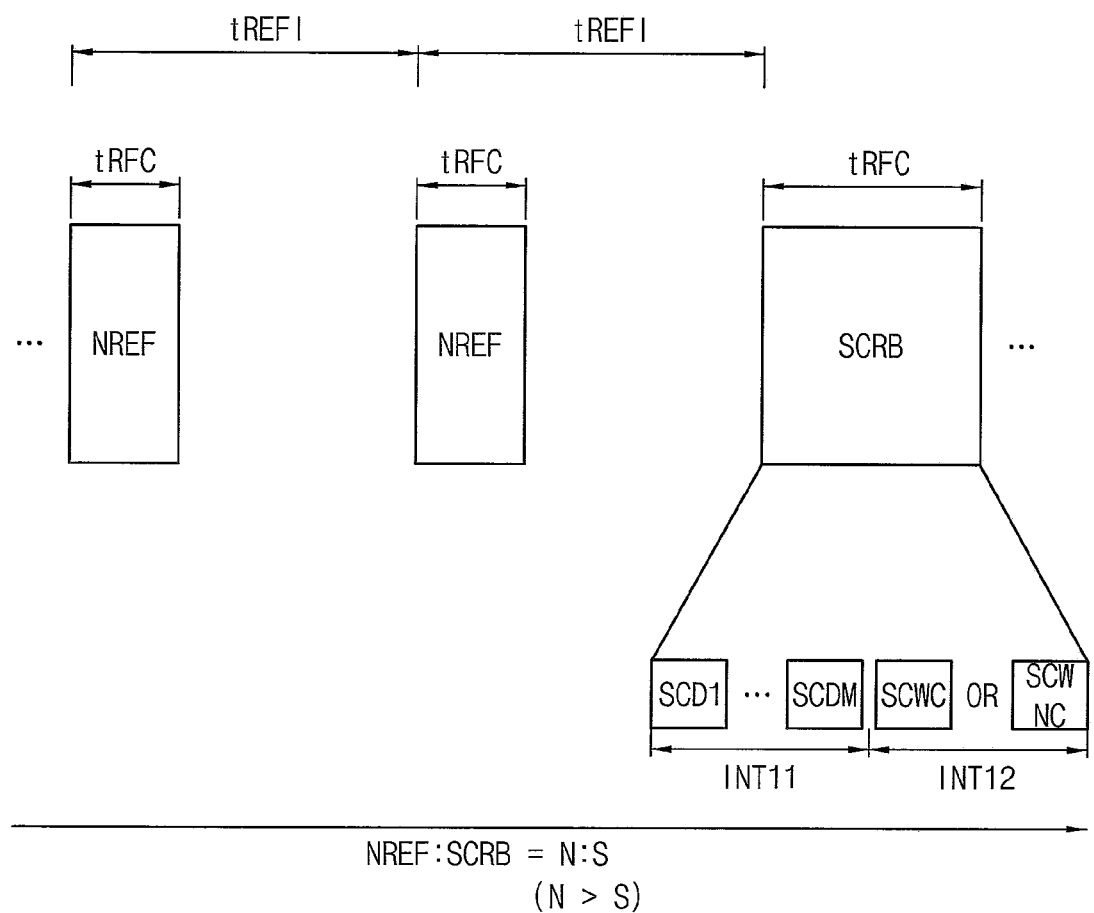
FIG. 22A illustrates that a normal refresh operation and a scrubbing operation are performed in the semiconductor memory device of FIG. 2 according to example embodiments.

FIG. 22A illustrates that a normal refresh operation and a scrubbing operation are performed in the semiconductor memory device 200 of FIG. 2 or 200a of FIG. 9 according to example embodiments.

In FIG. 22A, tRFC denotes a refresh cycle and means a time for refreshing one memory cell row, and tREFI denotes a refresh interval and means an interval between two consecutive refresh commands. The tREFI may be "average" interval between two consecutive refresh commands and the tRFC may be "minimum" delay between a refresh command and a next valid command. The next valid command may include a consecutive refresh command.

Referring to FIG. 22A, it is noted that the scrubbing control circuit 500 designates at least one memory cell row, on which the ECC circuit performs the scrubbing operation SCRB S times whenever the normal refresh operation NREF is performed on memory cell rows N times in response to the refresh command. S is a natural number smaller than N.

The scrubbing operation SCRB on one memory cell row includes M scrubbing error detection and correction operations SCD1~SCDM during a first interval INT11 and one of a scrubbing write back operation SCWC with writing back corrected data and scrubbing non-write back operation SCW-NC with skipping of writing back corrected data during a second interval INT12 of the scrubbing operation.

The ECC circuit 400 in the semiconductor memory device 200 or 200a sequentially read data corresponding a codeword from each of M sub-pages in the memory cell row, performs error detection and correction operation on M codewords to count a number of error occurrences during the first interval INT11 of the scrubbing operation and may writing back the corrected codeword or skipping of writing back the corrected codeword based on the number of error occurrences during the second interval INT12 of the scrubbing operation.

When the counted number of error occurrences is equal to or greater than the reference value VTH, a memory cell row including the number of errors equal to or greater than the reference value VTH has a high probability of occurrence of a row fault. Writing back the corrected codeword in a sub-page of the memory cell row in which the row fault occurs may generate a mis-corrected error in the memory cell row in which the row fault occurs and correctable errors in the memory cell row may be changed to uncorrectable errors.

Figure 22B:
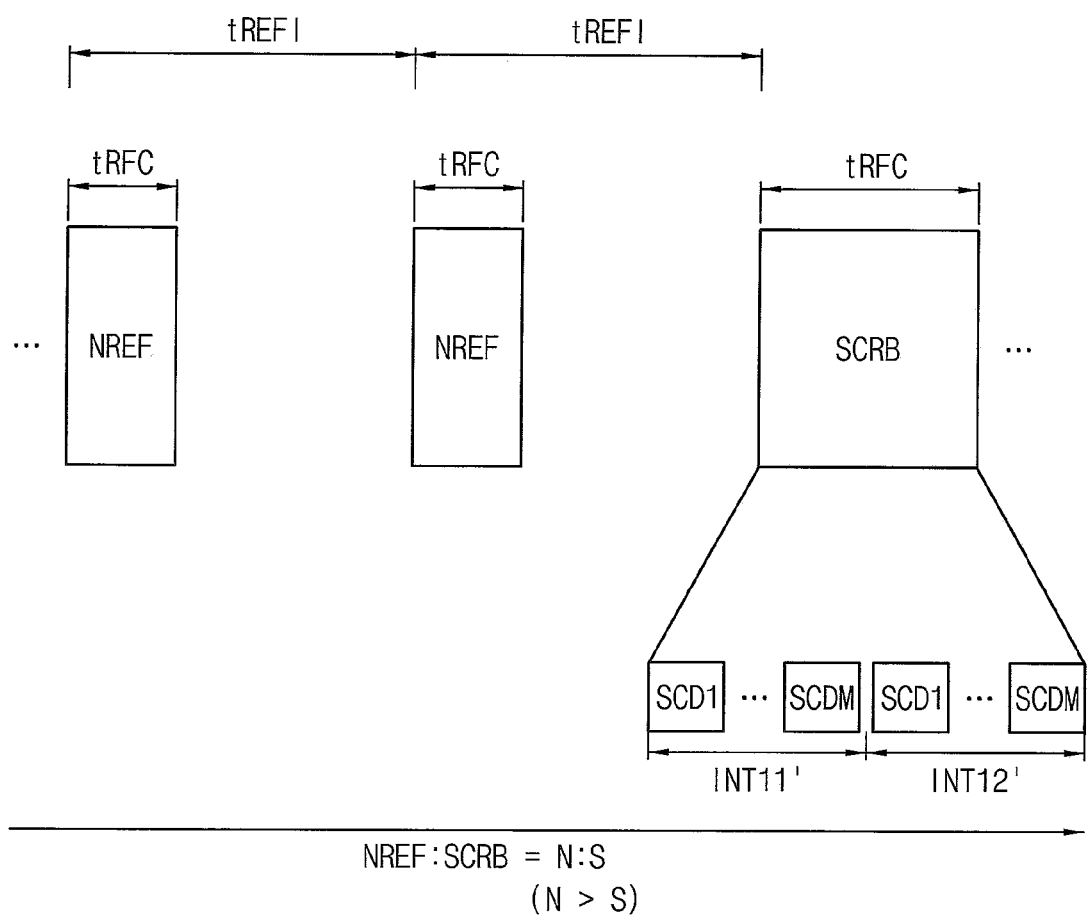
FIG. 22B illustrates that a normal refresh operation and an accelerated scrubbing operation are performed in the semiconductor memory device of FIG. 2 according to example embodiments.

FIG. 22B illustrates that a normal refresh operation and an accelerated scrubbing operation are performed in the semiconductor memory device 200 of FIG. 2 or 200a of FIG. 9 according to example embodiments.

FIG. 22B differs from FIG. 22A in a scrubbing operation SCRB'.

Referring to FIG. 22B, the scrubbing operation SCRB' includes M scrubbing error detection and correction operations SCD1~SCDM on one memory cell row (e.g., a first memory cell row) during a first interval INT11' and M scrubbing error detection and correction operations SCD1~SCDM on another memory cell row (e.g., a second memory cell row) during a second interval INT12'. When the counted number of error occurrences are equal to zero in the M scrubbing error detection and correction operations SCD1~SCDM on one memory cell row (e.g., the first memory cell row) during the first interval INT11', the M scrubbing error detection and correction operations SCD1~SCDM on another memory cell row (e.g., the second memory cell row) are performed during the second interval INT12' thus, the scrubbing operation on memory cell rows may be rapidly performed.

FIG. 23 illustrates that a scrubbing operation is performed in the semiconductor memory device 200 of FIG. 2 or 200a of FIG. 9.

In FIG. 23, a signal RMW is a signal that identifies a first interval and a second interval of the scrubbing operation, ECC_ON represents an ECC decoding operation associated with writing back the corrected data, the error threshold flag ETF is a signal indicates that the counted number of error occurrences are equal to or greater than the reference value and RFD_NO_ERR is a signal indicating that no error is detected in one memory cell row.

Referring to FIGS. 2 and 23, the ECC circuit 400 performs error detection and correction operation on a plurality of sub-pages in one memory cell row to count a number of error occurrences in a first interval INT21 of the scrubbing operation and the signal RFD_NO_ERR transits to a high level when the counted number of error occurrences is equal to zero. When the errors are detected in the first interval INT21 and the counted number of error occurrences is greater than zero and smaller than the reference value VTH, the signal RFD_NO_ERR transits to a low level and the signal ECC_ON transits to a high level in a second interval INT22 because the corrected data is written back in the second interval INT22.

Because error is not detected in a first interval INT31 by error detection and correction operation on another memory cell row, a second interval INT32 is very short, and error detection and correction operation may be performed on still another memory cell row during a third interval INT33.

Since the error threshold flag ETF is a low level each of intervals in FIG. 23, decoded row address DRA is not stored in the fault address register 580 as a row fault address.

Figure 24:
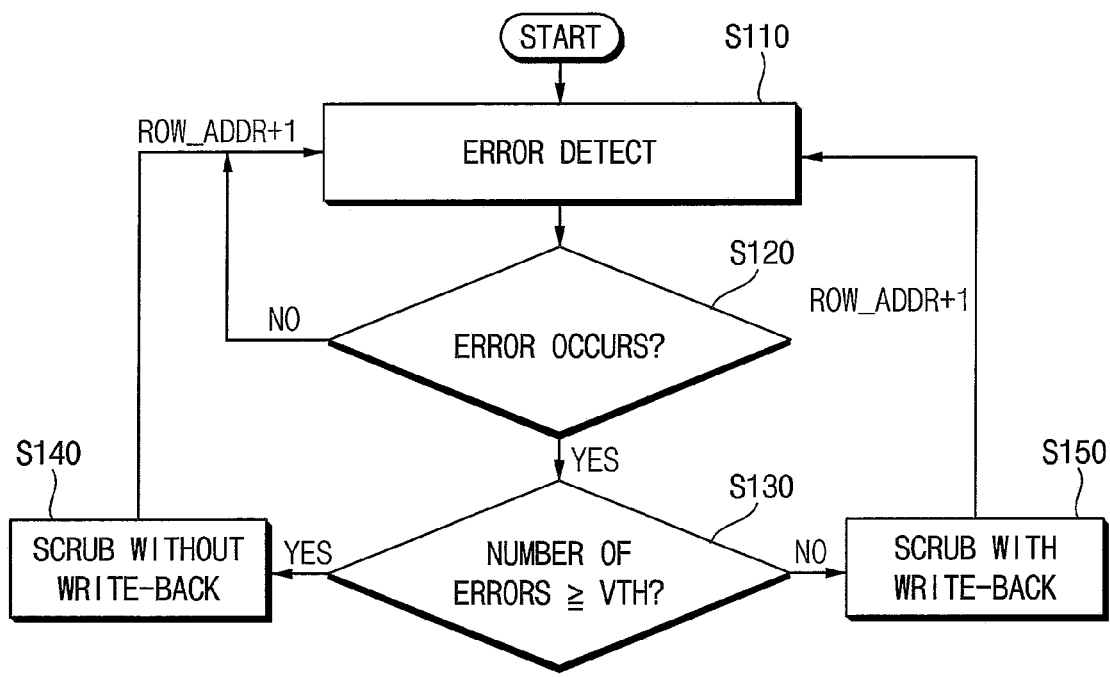
FIG. 24 is a flow chart illustrating a scrubbing operation according to example embodiments.

FIG. 24 is a flow chart illustrating a scrubbing operation according to example embodiments.

Referring to FIGS. 2 and 24, the ECC circuit 400 performs an error detection and correction operation on a first memory cell row by unit of codeword (operation S110), determines whether an error occurs in the first memory cell row (operation S120). When the error does not occur in the first memory cell row (NO in operation S120), the control logic circuit 210 increases a row address by one and the ECC circuit 400 performs an error detection operation on a second memory cell row.

When the error occurs in the first memory cell row (YES in operation S120), the control logic circuit 210 determines whether a number of error occurrences is equal to or greater than the reference value VTH (operation S130). When the number of error occurrences is equal to or greater than the reference value VTH (YES in operation S130), the ECC circuit 400 performs a scrubbing operation by skipping of writing back a corrected codeword (operation S140). When the number of error occurrences is smaller than the reference value VTH (NO in operation S130), the ECC circuit 400 performs the scrubbing operation by writing back the corrected codeword (operation S150).

Figure 25A:
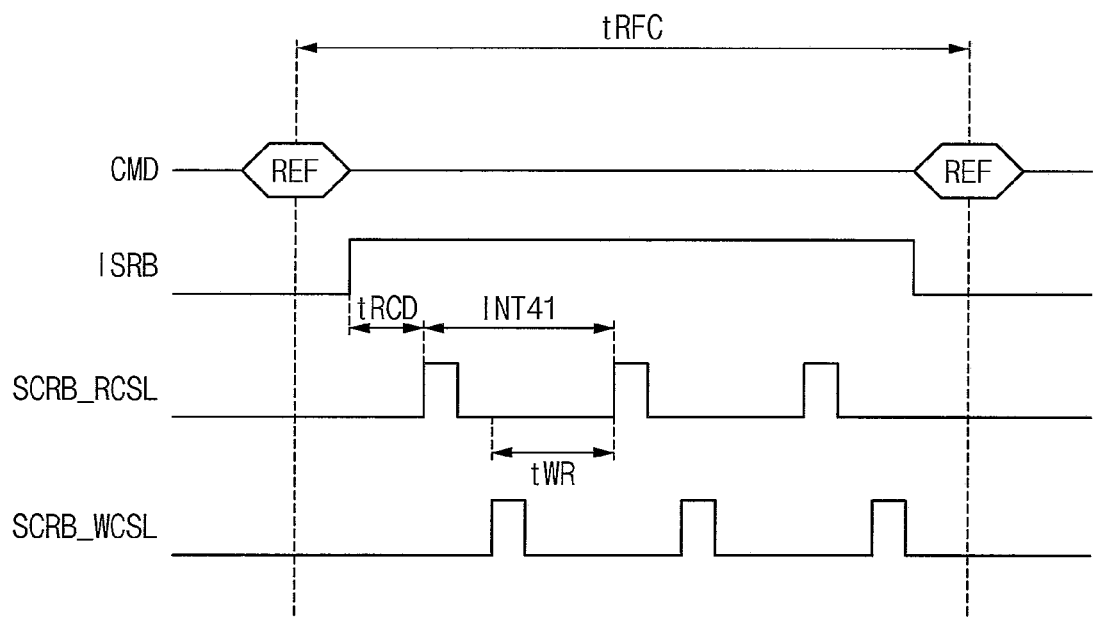
FIGS. 25A and 25B illustrate that a normal refresh operation and an accelerated scrubbing operation are performed, respectively, in the semiconductor memory device of according to example embodiments.
Figure 25B:
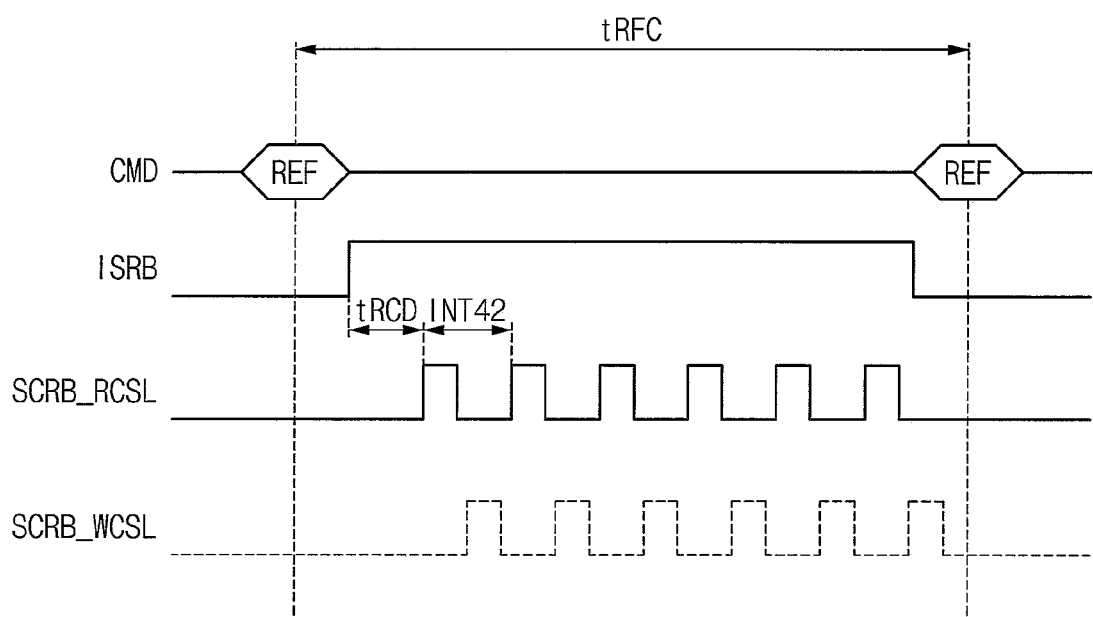

FIGS. 25A and 25B illustrate that a normal scrubbing operation and an accelerated scrubbing operation are performed, respectively, in the semiconductor memory device 200 of FIG. 2 or 200a of FIG. 9 according to example embodiments.

Referring to FIG. 25A, the scrubbing control circuit 500 in FIG. 2 or the scrubbing control circuit 500a in FIG. 13 activates the internal scrubbing signal ISRB during a refresh cycle tRFC corresponding to an interval between consecutive refresh commands REF.

The control logic circuit 210 or the control logic circuit 210a may control the column decoder 270 to consecutively generate read column selection signals SCRB_RCSL with a first period INT41 for selecting a portion of a plurality of bit-lines of a target page associated with the scrubbing operation. The column decoder 270 activates a first read column selection signals SCRB_RCSL after a time tRCD elapses from a time point at receiving a first refresh command REF. The control logic circuit 210 or the control logic circuit 210a may control the column decoder 270 to activate write column selection signals SCRB_WCSL for consecutively selecting a portion of bit-lines of the target page associated with writing back operation such that each of the read column selection signals SCRB RC_SL is activated after a time interval tWR elapses from activation of each of the write column selection signals SCRB_WCSL.

Referring to FIG. 25B, the scrubbing control circuit 500 in FIG. 2 or the scrubbing control circuit 500a in FIG. 13 activates the internal scrubbing signal ISRB during a refresh cycle tRFC corresponding to an interval between consecutive refresh commands REF.

The control logic circuit 210 or the control logic circuit 210a may control the column decoder 270 to consecutively generate read column selection signals SCRB_RCSL with a second period INT42 for selecting a portion of a plurality of bit-lines of a target page associated with the scrubbing operation. The column decoder 270 activates a first read column selection signals SCRB_RCSL after a time tRCD elapses from a time point at receiving a first refresh command REF. The control logic circuit 210 or the control logic circuit 210a may control the column decoder 270 to skip generation of write column selection signals SCRB_WCSL for consecutively selecting a portion of bit-lines of the target page associated with writing back operation.

In FIGS. 25A and 25B, the first interval INT41 may be G times greater than the second interval INT42 and G is a natural number equal to or greater than two. In some examples, G may be a positive integer greater than one.

Since the write column selection signals SCR_WCSL are not generated in FIG. 25B, the ECC circuit 400 may perform the scrubbing operation on more codewords (about two times more codewords) during the internal scrubbing signal ISRB is activated.

The scrubbing operation in FIG. 25B may be rapidly performed during an initial interval after a power is applied to the semiconductor memory device 200 or 200a and a memory cell row having a row fault may be rapidly detected. For example, the initial interval may be predetermined.

Figure 26A:
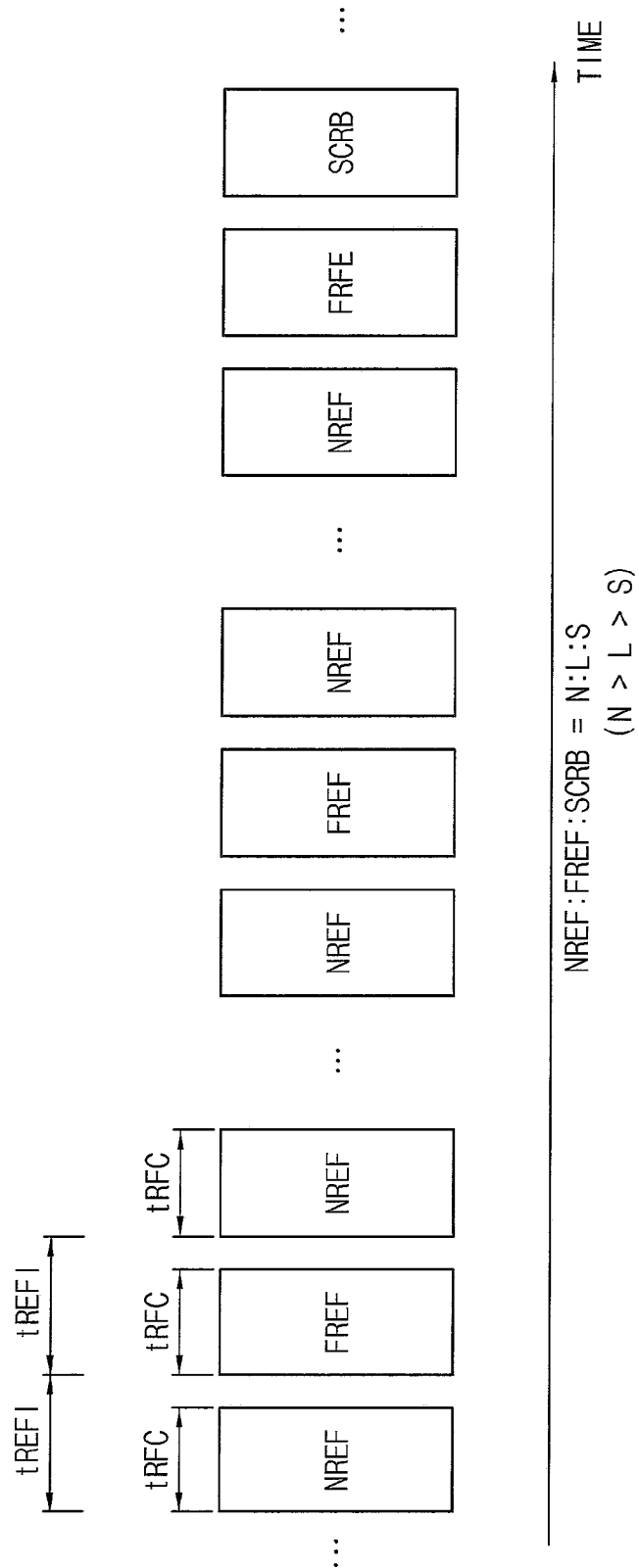
FIGS. 26A and 26B illustrate a refresh operation and a scrubbing operation performed in the semiconductor memory device of FIG. 2, respectively.
Figure 26B:
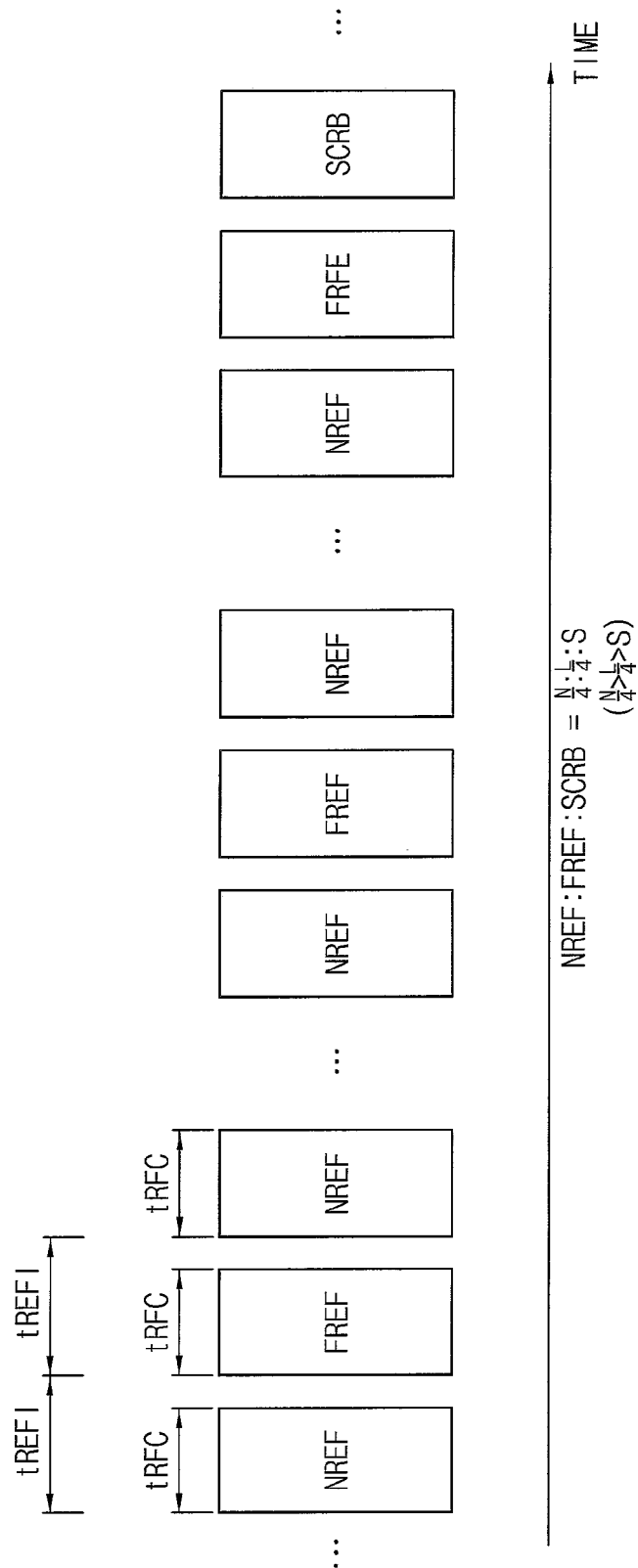

FIGS. 26A and 26B illustrate a refresh operation and a scrubbing operation performed in the semiconductor memory device 200 of FIG. 2 or 200a of FIG. 9, respectively.

Referring to FIG. 26A, it is noted that the scrubbing control circuit 500 designates memory cell rows, on which the ECC circuit 400 performs the scrubbing operation SCRB S times and a refresh operation FREF on an adjacent memory region corresponding to the victim address VCT_ADDR is performed L times whenever the normal refresh operation NREF is performed on memory cell rows N times in response to the refresh command. Here L is a natural number smaller than N and S is a natural number smaller than L.

Referring to FIG. 26B, it is noted that the scrubbing control circuit 500 designates memory cell rows, on which the ECC circuit 400 performs the scrubbing operation SCRB S times and a refresh operation FREF on an adjacent memory region corresponding to the victim address VCT_ADDR is performed L/4 times whenever the normal refresh operation NREF is performed on memory cell rows N/4 times in response to the refresh command, in the accelerated scrubbing operation. The control circuit 210 may control the scrubbing control circuit 500 to generate the scrubbing addresses with a period smaller than a normal period determined in a specification of the semiconductor memory device 200 or 200a during the scrubbing operation in an initial interval (e.g., a predetermined time interval) after a power is applied to the semiconductor memory device 200 or 200a.

The scrubbing operation in FIG. 26B is rapidly performed during an initial interval (e.g., a predetermined interval) after a power is applied to the semiconductor memory device 200 or 200a and a memory cell row having a row fault may be rapidly detected. In some examples, the accelerated scrubbing operation of FIG. 26B may be performed during the normal scrubbing operation in response to a specific control signal.

In FIGS. 25B and 26B, the control logic circuit 210 may control the ECC circuit 400 to perform a background write operation to write default data in the memory cell rows in the initial interval and to perform the scrubbing operation on the default data.

Figure 27:
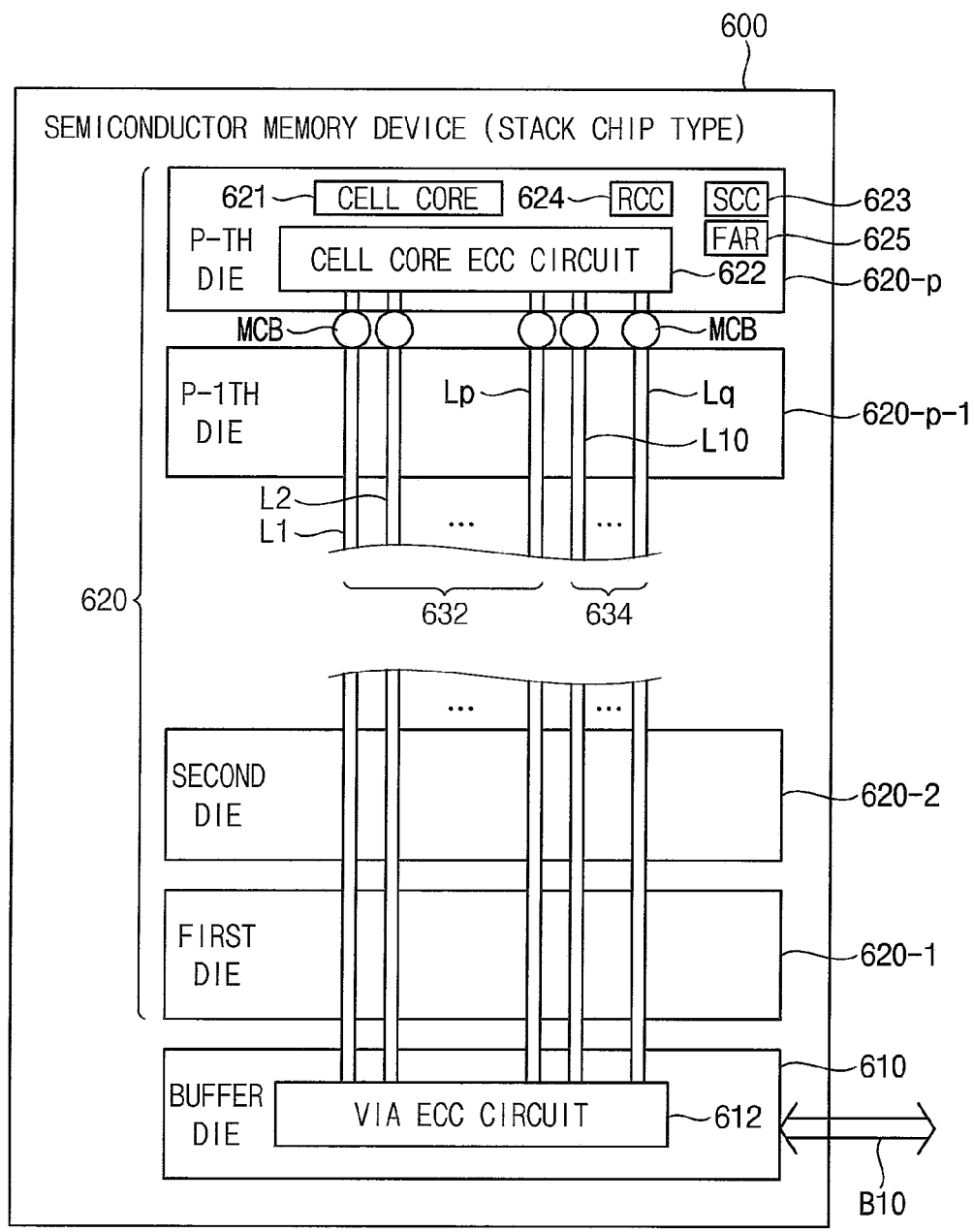
FIG. 27 is a block diagram illustrating a semiconductor memory device according to example embodiments.

FIG. 27 is a block diagram illustrating a semiconductor memory device according to example embodiments.

Referring to FIG. 27, a semiconductor memory device 600 may include a buffer die 610 and a group of dies 620 providing a soft error analyzing and correcting function in a stacked chip structure.

The group of dies 620 may include a plurality of memory dies 620-1 to 620-p which is stacked on the buffer die 610 and conveys data through a plurality of through substrate via (e.g., through silicon via (TSV)) lines.

At least one of the memory dies 620-1 to 620-p may include a cell core 621 including a memory cell array, an ECC circuit 622 which generates transmission parity data based on transmission data to be sent to the buffer die 611, a refresh control circuit (RCC) 624, a scrubbing control circuit (SCC) 623 and a fault address register (FAR) 625. The ECC circuit 622 may be referred to as 'cell core ECC circuit'. The ECC circuit 622 may employ the ECC circuit 400 of FIG. 2 or FIG. 9. The refresh control circuit 624 may employ the refresh control circuit 385 of FIG. 4. The scrubbing control circuit 623 may employ the scrubbing control circuit 500 of FIG. 7 or the scrubbing control circuit 500a of FIG. 13.

The ECC circuit 622 and the scrubbing control circuit 623 may perform a scrubbing operation on memory cell rows in the memory die when a refresh operation is performed on the memory cell row. The ECC circuit 622 performs error detection and correction operation on a first memory cell row to count a number of error occurrences in a first interval of the scrubbing operation and may perform the error detection and correction operation on a second memory cell row in a second interval of the scrubbing operation when the counted number of error occurrences is equal to zero. Therefore, the ECC circuit 622 may rapidly perform the scrubbing operation on memory cell rows.

The buffer die 610 may include a via ECC circuit 612 which corrects a transmission error using the transmission parity data when a transmission error is detected from the transmission data received through the TSV liens and generates error-corrected data.

The semiconductor memory device 600 may be a stack chip type memory device or a stacked memory device which conveys data and control signals through the TSV lines. The TSV lines may be also called 'through electrodes'.

A data TSV line group 632 which is formed at least one of the memory dies 620-1 to 620-p may include TSV lines L1 to Lp, and a parity TSV line group 634 may include TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected to the memory controller 100 through the data bus B10.

The via ECC circuit 612 may determine whether a transmission error occurs at the transmission data received through the data TSV line group 632, based on the transmission parity data received through the parity TSV line group 634. When a transmission error is detected, the via ECC circuit 612 may correct the transmission error on the transmission data using the transmission parity data. When the transmission error is uncorrectable, the via ECC circuit 612 may output information indicating occurrence of an uncorrectable data error.

Figure 28:
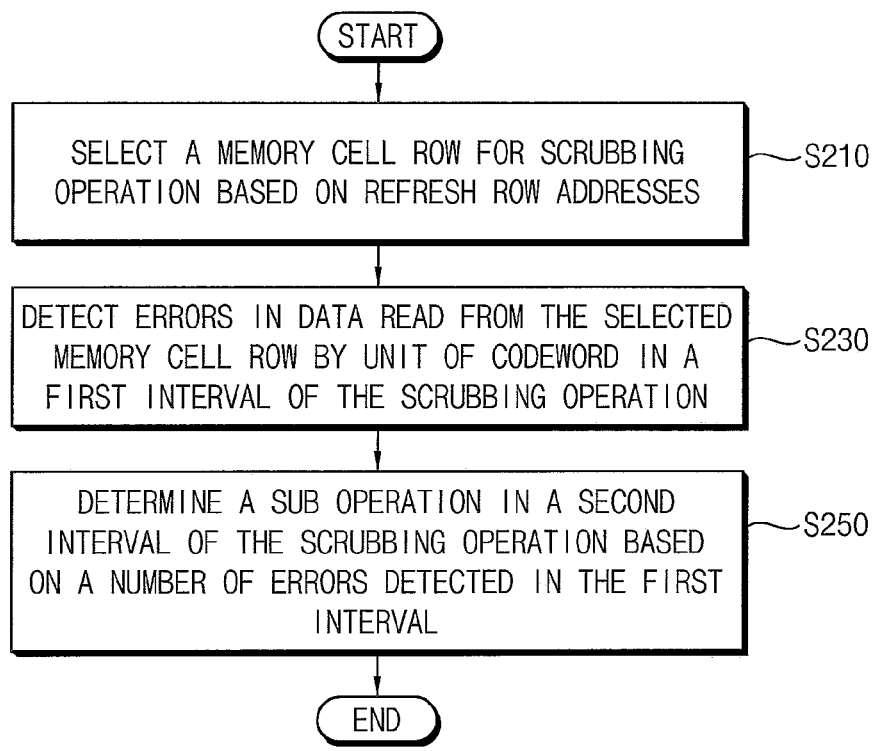
FIG. 28 is a flow chart illustrating a method of a semiconductor memory device according to example embodiments.

FIG. 28 is a flow chart illustrating an operation method of a semiconductor memory device according to example embodiments.

Referring to FIGS. 1 to 21, 22A, 22B, 23, 24, 25A, 25B, 26A, 26B, 27, and 28, in a method of operating a semiconductor memory device including a memory cell array 300 which includes a plurality of memory cell rows and each of the plurality of memory cell rows includes a plurality of volatile memory cells, a memory cell row for performing scrubbing operation is selected from the memory cell rows based on refresh row addresses (operation S210). That is, the scrubbing control circuit 500 or 500a may generate scrubbing addresses by counting the refresh row addresses.

The ECC circuit 400 performs error detection and correction operation on a plurality of sub-pages in the selected memory cell row to count a number of error occurrences in a first interval of the scrubbing operation (operation S230). The ECC circuit 400 may determine a sub operation to be performed in a second interval of the scrubbing operation based in the counted number of error occurrences in the first interval (operation S250).

The control logic circuit 210 may skip writing back the corrected codeword in response to the counted number of error occurrences being equal to or greater than a reference value in the second interval. The control logic circuit 210 may write back the corrected codeword in a corresponding sub-page in response to the counted number of error occurrences being smaller than the reference value and greater than zero in the second interval. The control logic circuit 210 may perform error detection and correction operation on a plurality of sub-pages in a second memory cell row in the second interval in response to the counted number of error occurrences being zero.

Figure 29:
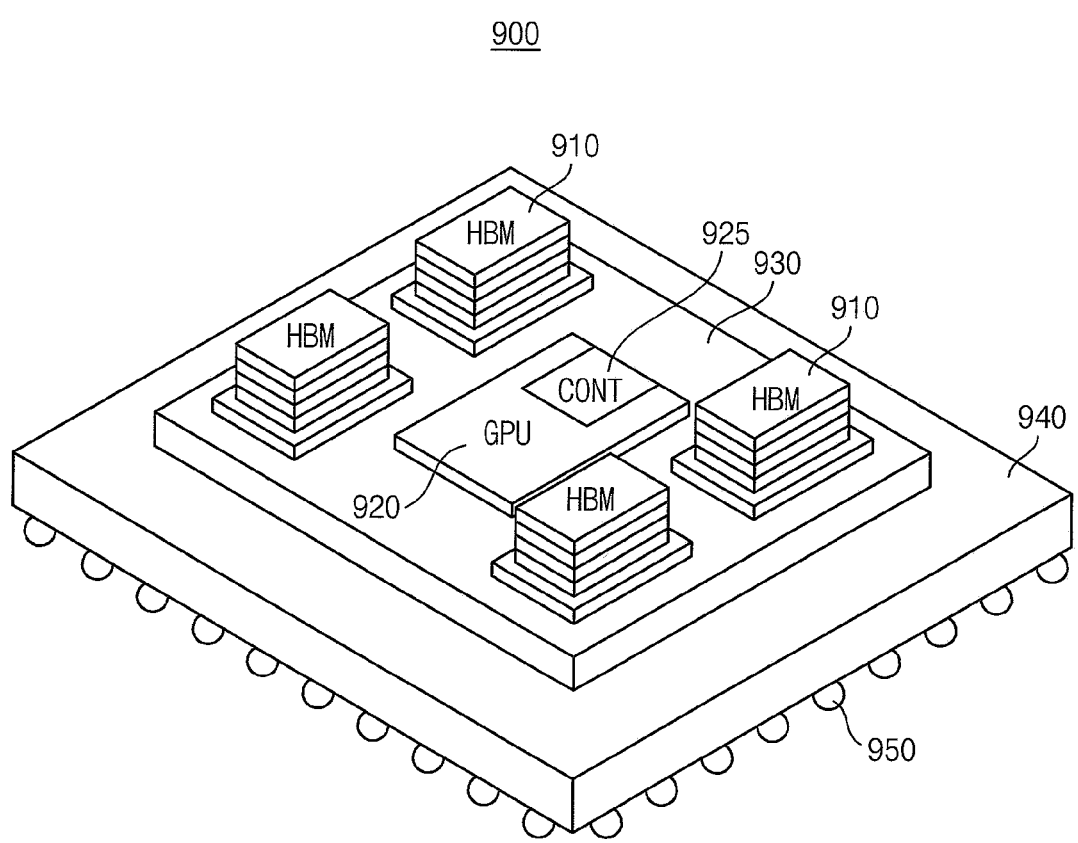
FIG. 29 is a diagram illustrating a semiconductor package including the stacked memory device, according to example embodiments.

FIG. 29 is a diagram illustrating a semiconductor package including the stacked memory device, according to example embodiments.

Referring to FIG. 29, a semiconductor package 900 may include one or more stacked memory devices 910 and a graphic processing unit (GPU) 920. The GPU 920 may include a memory controller 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include the memory cell array, the ECC circuit, the scrubbing control circuit and the fault address register as described previously.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, a semiconductor memory device includes an ECC circuit, a scrubbing control circuit and a fault address register. The ECC circuit sequentially performs error detection and correction operation on codewords in a memory cell row designated by a scrubbing address provided from the scrubbing control circuit to count a number of error occurrences in a first interval of the scrubbing operation and may determine a sub operation in a second period of the scrubbing operation based on the counted number of error occurrences. Therefore, the ECC circuit may rapidly perform scrubbing operation during an initial interval after a power is applied to the semiconductor memory device and a memory cell row having a row fault may be rapidly detected.

Aspects of the present inventive concept may be applied to systems using semiconductor memory devices that employ an ECC circuit. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present disclosure as defined in the appended claims.

What is claimed is:

1. A semiconductor memory device comprising:
    a memory cell array including a plurality of memory cell rows, each of the plurality of memory cell rows including volatile memory cells coupled to a plurality of bit-lines;
    an error correction code (ECC) circuit;
    a scrubbing control circuit configured to generate scrubbing addresses for performing a scrubbing operation on a first memory cell row from among the plurality of memory cell rows; and
    a control logic circuit configured to:
    control the ECC circuit such that the ECC circuit performs an error detection operation on a plurality of codewords of a plurality of sub-pages in the first memory cell row to count a number of error occurrences during a first interval in the scrubbing operation, and
    determine a sub operation in a second interval in the scrubbing operation after the first interval based on the number of error occurrences in the first memory cell row,
    wherein in the scrubbing operation, the control logic circuit is configured to control the scrubbing control circuit to generate the scrubbing addresses with a second period smaller than a first period determined in a specification of the semiconductor memory device during an initial interval after a power is applied to the semiconductor memory device, and
    wherein the initial interval is a predetermined interval.

2. The semiconductor memory device of claim 1, wherein the control logic circuit is configured to, in response to the number of error occurrences in the first memory cell row being a zero, control the ECC circuit to perform the error detection operation on a plurality of sub-pages in a second memory cell row from among the plurality of memory cell rows, the second memory cell row being different from the first memory cell row.

3. The semiconductor memory device of claim 1, wherein the control logic circuit is configured to, in response to the number of error occurrences being greater than zero and smaller than a reference value, control the ECC circuit to write back a corrected codeword in a corresponding sub-page of the first memory cell row during the second interval of the scrubbing operation.

4. The semiconductor memory device of claim 1, wherein the control logic circuit is configured to, in response to the number of error occurrences being equal to or greater than a reference value, control the ECC circuit not to write back a corrected codeword in a corresponding sub-page of the first memory cell row during the second interval of the scrubbing operation.

5. The semiconductor memory device of claim 1, further comprising:
    a fault address register,
    wherein the control logic circuit is further configured to control the ECC circuit to perform a row fault detection operation to selectively store a row address of the first memory cell row in the fault address register as a row fault address based on the number of error occurrences in the first memory cell row.

6. The semiconductor memory device of claim 5, wherein the control logic circuit is configured to perform a soft post package repair on a memory cell row corresponding to the row fault address by storing data stored in the memory cell row corresponding to the row fault address in a redundancy region of the memory cell array.

7. The semiconductor memory device of claim 1, further comprising:
    a column decoder configured to consecutively generate column selection signals with a first period for selecting a portion of the plurality of bit-lines, in response to a column address in a normal mode,
    wherein the control logic circuit is configured to control the column decoder such that during an initial interval after a power is applied to the semiconductor memory device, the column decoder generates read column selection signals with a second period smaller than the first period, the read column selection signals being associated with a read operation that is performed in the first interval of the scrubbing operation, and
    wherein the initial interval is a predetermined interval.

8. The semiconductor memory device of claim 7, wherein the control logic circuit is configured to control the column decoder such that the column decoder skips generation of write column selection signals associated with a write operation corresponding to the read operation in the first interval of the scrubbing operation.

9. The semiconductor memory device of claim 7, wherein the first period is G times greater than the second period and G is a natural number equal to or greater than two.

10. The semiconductor memory device of claim 7, wherein an interval during which the scrubbing operation is performed is determined based on consecutive refresh commands received from an outside of the semiconductor memory device.

11. The semiconductor memory device of claim 1, wherein the control logic circuit is configured to store a row address of the first memory cell row in a fault address register as a row fault address in response to the number of error occurrences in the first memory cell row detected in the first interval being equal to or greater than K, K being a natural number equal to or greater than two, the fault address register being included in the semiconductor memory device.

12. The semiconductor memory device of claim 1, wherein the ECC circuit includes an ECC decoder configured to perform the error detection operation on the plurality of codewords, and
wherein the ECC decoder includes:
 a data latch configured to store the plurality of codewords;
 a syndrome generation circuit configured to generate a syndrome based on a main data and a parity data of each of the plurality of codewords;
 an error locator configured to generate an error position signal indicating a position of at least one error bit in the main data, based on the syndrome; and
 a data corrector configured to receive codewords which are selected from the plurality of codewords stored in the data latch, and configured to correct an error bit in each of the selected codewords.

13. A method of operating a semiconductor memory device including a memory cell array that includes a plurality of memory cell rows, each of the plurality of memory cell rows including a plurality of volatile memory cells, the method comprising:
 selecting a first memory cell row for a scrubbing operation from among the plurality of memory cell rows;
 performing, by an error correction code (ECC) circuit, an error detection operation on a plurality of codewords of a plurality of sub-pages in the first memory cell row to count a number of error occurrences during a first interval in a scrubbing operation;
 determining whether to perform a sub operation of writing back a corrected codeword in a corresponding sub-page in the first memory cell row in a second interval of the scrubbing operation after the first interval based on the number of error occurrences; and
 performing, by the ECC circuit, a row fault detection operation to selectively store a row address of the first memory cell row in a fault address register as a row fault address based on the number of error occurrences in the first memory cell row.

14. The method of claim 13, further comprising:
 performing, by the ECC circuit, the error detection operation on a plurality of sub-pages in a second memory cell row from among the plurality of memory cell rows, in response to the number of error occurrences in the first memory cell row being a zero, the second memory cell row being different from the first memory cell row.

15. The method of claim 13, further comprising:
 performing, by the ECC circuit, the writing back of the corrected codeword in the corresponding sub-page of the first memory cell row during the second interval of the scrubbing operation, in response to the number of error occurrences being greater than zero and smaller than a reference value.

16. The method of claim 13, further comprising:
 skipping, by the ECC circuit, the writing back of the corrected codeword in the corresponding sub-page of the first memory cell row during the second interval of the scrubbing operation, in response to the number of error occurrences being equal to or greater than a reference value.

17. A semiconductor memory device comprising:
 a memory cell array including a plurality of memory cell rows, each of the plurality of memory cell rows including volatile memory cells;
 an error correction code (ECC) circuit;
 a fault address register;
 a scrubbing control circuit configured to:
 generate scrubbing addresses,
 perform a scrubbing operation on a first memory cell row from among the plurality of memory cell rows; and
 a control logic circuit configured to:
 control the ECC circuit such that the ECC circuit performs an error detection operation on a plurality of codewords of a plurality of sub-pages in the first memory cell row to count a number of error occurrences during a first interval in the scrubbing operation,
 perform a row fault detection operation to selectively store a row address of the first memory cell row in the fault address register as a row fault address based on the number of error occurrences in the first memory cell row, and
 skip an ECC decoding operation on a memory cell row designated by an access address in response to the access address matching the row fault address.

18. The semiconductor memory device of claim 17, wherein the control logic circuit is configured to store a row address of the first memory cell row in the fault address register as the row fault address in response to the number of error occurrences in the first memory cell row detected in the first interval being equal to or greater than K, K being a natural number equal to or greater than two.

* * * * *